(12) United States Patent
Shelton et al.

(10) Patent No.: US 9,762,435 B2
(45) Date of Patent: Sep. 12, 2017

(54) SYSTEM AND METHOD FOR MONITORING AND MANAGING DATA CENTER RESOURCES INCORPORATING A COMMON DATA MODEL REPOSITORY

(75) Inventors: James H. Shelton, Cooper City, FL (US); Roy D. Pestone, Mount Vernon, NY (US); Steffen C. Hulegaard, Tiburon, CA (US); Kenneth L. Harper, Coral Springs, FL (US)

(73) Assignee: AVOCENT HUNTSVILLE, LLC, Huntsville, AL (US)

( * ) Notice: Subject to any disclaimer, the term of this patent is extended or adjusted under 35 U.S.C. 154(b) by 339 days.

(21) Appl. No.: 13/877,485

(22) PCT Filed: Sep. 30, 2011

(86) PCT No.: PCT/US2011/054249
§ 371 (c)(1),
(2), (4) Date: Jun. 13, 2013

(87) PCT Pub. No.: WO2012/047756
PCT Pub. Date: Apr. 12, 2012

(65) Prior Publication Data
US 2013/0262685 A1    Oct. 3, 2013

Related U.S. Application Data

(60) Provisional application No. 61/389,616, filed on Oct. 4, 2010, provisional application No. 61/488,431, filed on May 20, 2011.

(51) Int. Cl.
*H04L 12/24* (2006.01)
*G06F 1/20* (2006.01)
(Continued)

(52) U.S. Cl.
CPC ............ *H04L 41/08* (2013.01); *G06F 1/206* (2013.01); *G06F 1/3203* (2013.01); *G06F 8/24* (2013.01);
(Continued)

(58) Field of Classification Search
CPC .... G06Q 10/00; G06Q 10/0631; G06Q 10/10; G06F 17/30607; G06F 17/30557;
(Continued)

(56) References Cited

U.S. PATENT DOCUMENTS 6,470,354 B1 * 10/2002 Aldridge et al.
6,912,520 B2 *  6/2005 Hankin et al.
(Continued)

FOREIGN PATENT DOCUMENTS

CN      101546259 A    9/2009
JP       10259944 A    9/1998
(Continued)

OTHER PUBLICATIONS

Anonymous: "Object-relational mapping," Wikipedia, Sep. 11, 2010 (Sep. 11, 2010), pp. 1-3, XP002663280, Retrieved from the Internet: URL:http://en.wikipedia.org/w/index.php?title=Object-relational-mapping&oldid=384285333 [retrieved on Nov. 11, 2011].
(Continued)

*Primary Examiner* — Dustin Nguyen
*Assistant Examiner* — Matthew Ballard
(74) *Attorney, Agent, or Firm* — Harness, Dickey & Pierce, P.L.C.

(57) ABSTRACT

A system is disclosed that forms a base platform that enables a plurality of objects to be used in forming a plurality of different domain models. The system may have a common data model repository (CDMR) having an object relational mapping layer for mapping instances of the objects to persistent storage. The instances of objects may represent
(Continued)

information that includes connections and control capabilities for at least certain ones of the instances of objects, and the CDMR may implement the connections and control capabilities in relation to managed elements.

23 Claims, 42 Drawing Sheets

(51) Int. Cl.
*G06F 1/32* (2006.01)
*G06F 9/44* (2006.01)
*G06F 11/30* (2006.01)
*H05K 7/14* (2006.01)
*G06F 11/34* (2006.01)

(52) U.S. Cl.
CPC ...... *G06F 11/3006* (2013.01); *G06F 11/3051* (2013.01); *G06F 11/3058* (2013.01); *G06F 11/3072* (2013.01); *H04L 41/0226* (2013.01); *H05K 7/1498* (2013.01); *G06F 11/3409* (2013.01); *G06F 11/3442* (2013.01); *H04L 41/0253* (2013.01); *H04L 41/04* (2013.01); *Y02B 60/1275* (2013.01); *Y02B 60/165* (2013.01)

(58) Field of Classification Search
CPC ......... G06F 17/30604; G06F 17/30914; G06F 17/30595; G06F 3/0631; G06F 8/71; Y10S 707/99945; Y10S 707/99944; Y10S 707/99952; H04L 41/0233; H04L 41/046; H04L 41/0631; H04L 41/0893
See application file for complete search history.

(56) References Cited

U.S. PATENT DOCUMENTS 7,606,813 B1* 10/2009 Gritsay et al.
7,756,945 B1* 7/2010 Andreessen et al. ......... 709/217
8,121,990 B1* 2/2012 Chapweske et al. ......... 707/695
2003/0229610 A1* 12/2003 Van Treeck ...................... 707/1
2006/0200438 A1* 9/2006 Schloming ........................ 707/1
2008/0005161 A1* 1/2008 Grealish ............. H04L 41/0233
2008/0028058 A1* 1/2008 Shaw ...................... H04L 12/24
709/223
2008/0222603 A1* 9/2008 Shaw .................. G06F 9/45512
717/120
2009/0144696 A1 6/2009 Andersen
2010/0306254 A1* 12/2010 Williamson ................... 707/770
2011/0029673 A1* 2/2011 Jaisinghani ............ H04L 41/12
709/226
2011/0179280 A1* 7/2011 Imrey et al. .................. 713/178
2011/0191702 A1* 8/2011 Lunsford ............... G06F 3/048
715/763

FOREIGN PATENT DOCUMENTS

JP 2006284175 A 10/2006
JP 2007285539 A 11/2007

OTHER PUBLICATIONS

Avocent: "Data Center Infrastructure Management (DCIM) White paper," Internet citation, Sep. 2010 (Sep. 2010), pp. 1-16, XP002663281, Retrieved from the Internet: URL:http://www.edcosurge.com/en-US/About/Events/Documents/00W-MediaKit/10_DCIM_Trellis.pdf [retrieved on Nov. 9, 2011].
International Search Report and Written Opinion for PCT/US2011/054249, dated Nov. 29, 2011; ISA/EP.
Giovanni Cortese et al. "Building Customizable Frameworks for the Telecommunications Domain: A Comparison of Approaches", 2000, Software Reuse: Advances in Software eusability; [Lecture Notes in Computer Science; LNCS], Springer-Verlag, Berlin/Heidelberg, pp. 78-88, XP019001005, ISBN: 978-3-540-67696-6.
Supplementary European Search Report for corresponding European Patent Application No. 09712912.6 dated Dec. 18, 2014.
Yang Yibing, "Based on ORM to Persistence Layer Framework of Hibernate", Computer Programming Skills and Maintenance, Feb. 2010, pp. 30-32.

* cited by examiner

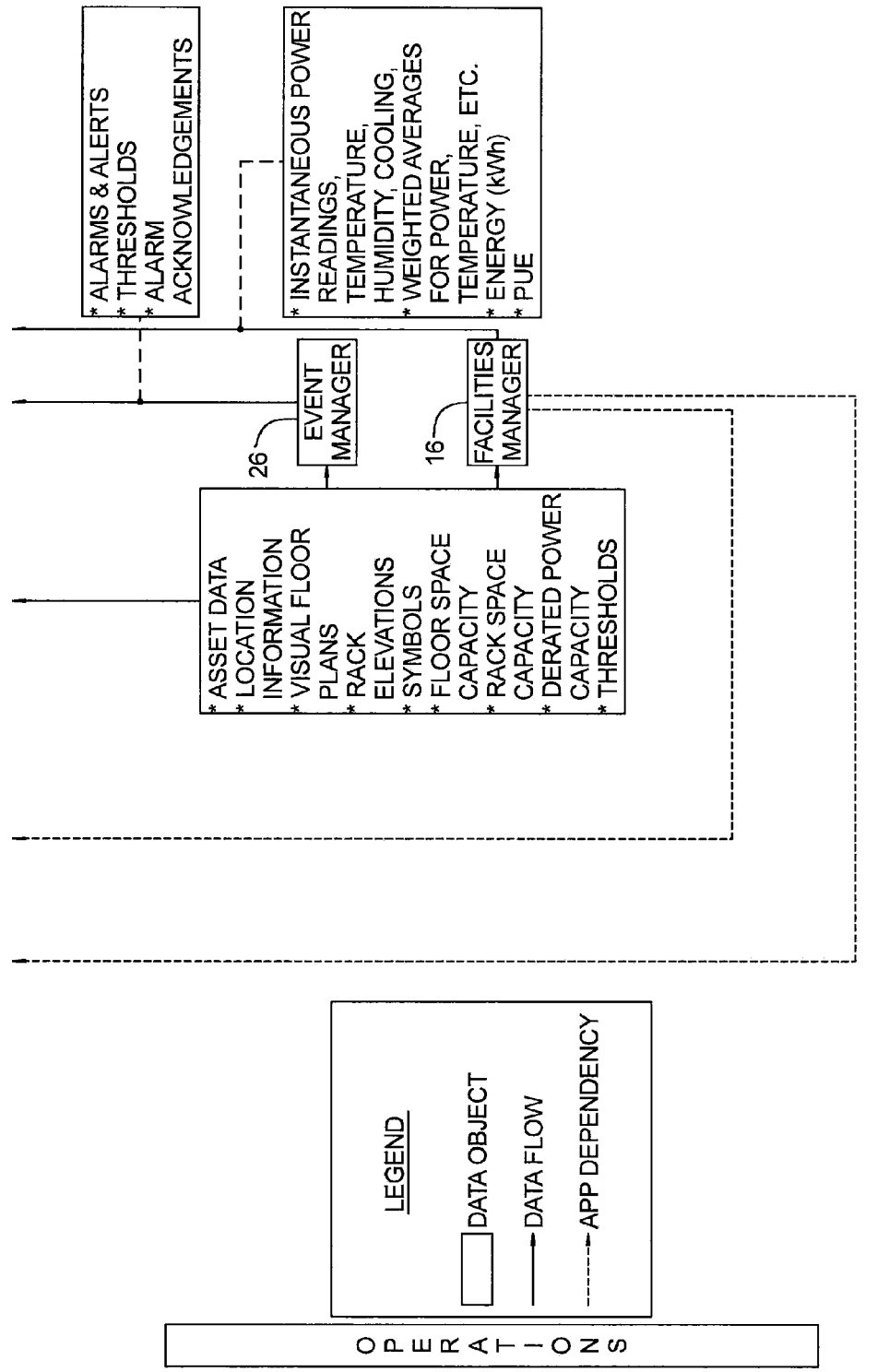

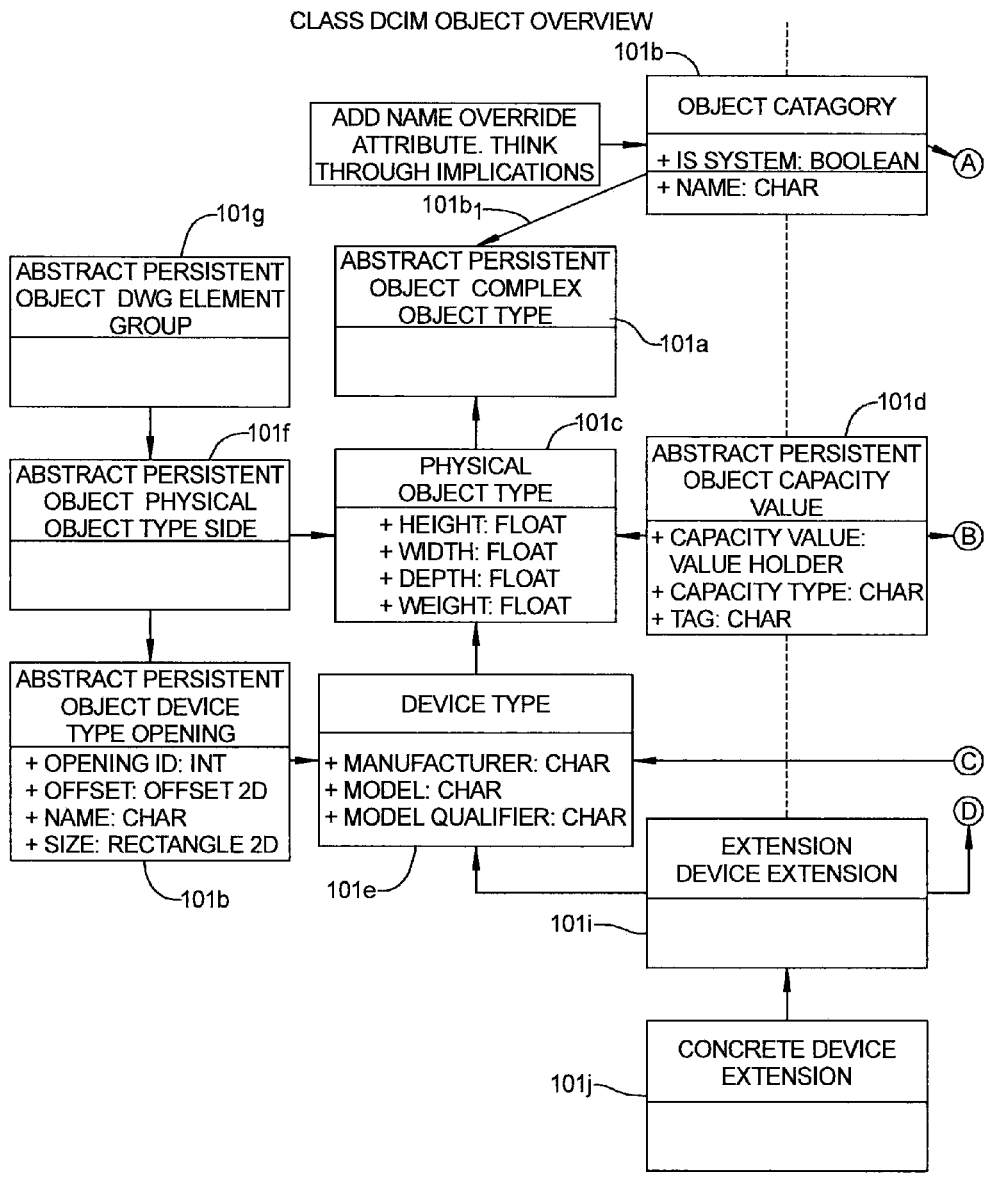
FIGURE 10A1

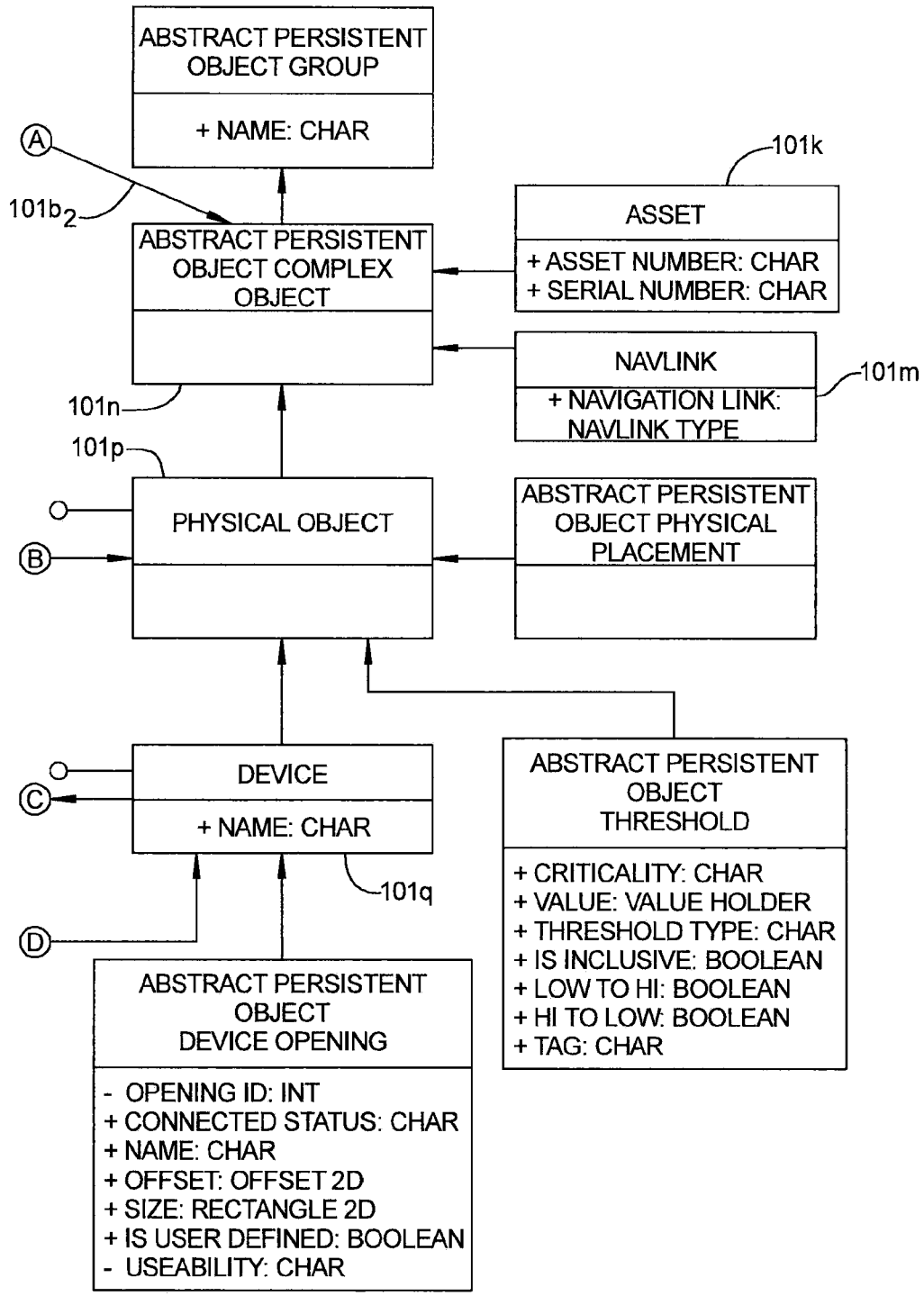
FIGURE 10A2

| Category | Use Case ID | Title |
|---|---|---|
| Base Model | UC CDMR DS 0002 | Define a domain model class |
| Base Model | UC CDMR DS 0001 | Define a data access object |
| Base Model | UC CDMR DS 0003 | Define an extension class |
| UDP/UDC | UC DO 0270 1 | User Defined Property (UDP) for Servers |
| UDP/UDC | UC DO 0260 1 | User Defined Class |
| Persistence Ignorance | UC CDMR DB 0001 | Database choice at Install |
| Object Manipulation | UC CDMR OM 0001 | Object Promotion |
| Object Manipulation | UC CDMR OM 0002 | Object Merging |
| Data Integrity | UC CDMR D1 0001 | Cascading Delete |
| Concurrency Controls | UC CDMR CC 0001 | Multiple Updates |
| Object Identity | UC CDMR OI 0001 | Adding Object with Unique Id |
| Authorization Enforcement | UC CDMR AE 0001 | Change Objects with Authorization Enforcement |
| Authorization Enforcement | UC CDMR AE 0002 | Retrieving Objects with Authorization Enforcement |
| Tenancy Enforcement | UC CDMR TE 0001 | Change Objects with Tenancy Enforcement |
| Tenancy Enforcement | UC CDMR TE 0002 | Retrieving Objects with Authorization Enforcement |
| Temporality | UC CDMR TM 0001 | Change Temporal Objects |
| Temporality | UC CDMR TM 0002 | Retrieving Temporal Objects |
| Staging Area | UC CDMR SA 0001 | Changing Objects within a Staging Area |
| Staging Area | UC CDMR SA 0002 | Committing Objects in Staging Area |
| Notifications | UC CDMR NO 0001 | Notification Registration |
| Notifications | UC CDMR NO 0002 | Distribute Notifications |
| Serialization | UC CDMR SE 0001 | Serialize Object |

FIGURE 11

8.2.2.1 UC-CDMR-DS-0002 - Define a domain model class

| | |
|---|---|
| Description | Define a domain model class<br><br>Domain Model Developer defines a new domain model class to represent an object in the domain |
| Actors | Domain Model Developer |
| Pre-Conditions | Domain Model Designer has designed the domain model class, indicating the class to be extended and the set of classes (interfaces) that needed to be implemented by the new class. The set of properties and methods are defined as well. |
| Post-Conditions | Success end condition<br>New domain model class is defined in the Domain Model.<br>Failure end condition<br>No domain model class is defined.<br>Minimal Guarantee<br>None |
| Trigger | 1. New domain model object is required/needed by one or more CDM Consumers. |
| Main Flow | 1. Create a java class for the new domain model class.<br>2. Define the java class to extend the appropriate class. This class should be extended (java inheritance) from one of the CDMR base classes or a class that has one of the CMDR base classes in its path.<br>3. Define the java class to implement all of the appropriate interfaces. These interfaces should be from the set of CDMR base interface classes or an interface that is extending one of the CDMR base interface classes.<br>4. Define any additional properties and additional methods for this class.<br>5. Identify if the class or if any of its properties are temporal.<br>6. Define any relationships with other domain model classes. |
| Alternate Flows | None |
| Assumptions | None |
| Exceptions | None |
| Variations | None |
| Notes and Issues | None |

FIGURE 11A

8.2.2.2 UC-CDMR-DS-0001 – Define a data access object

| | |
|---|---|
| Description | Define a data access object (DAO)<br><br>Domain Model Developer defines a new data access object class for a specific type of object in the domain to provide additional searching and processing capabilities needed by CDM Consumers. |
| Actors | Domain Model Developer |
| Pre-Conditions | Domain Model Designer has designed the data access object class, indicating the class to be extended by the new class. The set of additional methods (searching/processing) are defined as well. |
| Post-Conditions | Success end condition<br>New data access object class is defined in the Domain Model<br><br>Failure end condition<br>No data access object class is defined.<br><br>Minimal Guarantee<br>None |
| Trigger | 1. New data access object class is required/needed by one or more CDM Consumers. |
| Main Flow | 1. Create a java class for the new data access object class.<br><br>2. Define the java class to extend the appropriate class. This class should be extended (java inheritance) from one of the CDMR base data access object classes or a class that has one of the CDMR base data access object classes in its path.<br><br>3. Define any additional methods (searching/processing) for this class. |
| Alternate Flows | None |
| Assumptions | None |
| Exceptions | None |
| Variations | None |
| Notes and Issues | None |

FIGURE 11 B

8.2.2.3 UC-CDMR-DS-0003 - Define an extension class

| | |
|---|---|
| Description | Define a domain model extension class<br><br>Domain Model Developer defines a new domain model extension class to represent additional information or another perspective of an object in the domain. |
| Actors | Domain Model Developer |
| Pre-Condition | Domain Model Designer has designed the domain model extension class, indicating the class to be extended and the set of classes (interfaces) that needed to be implemented by the new extension class. The set of properties and methods are defined as well. |
| Post-Conditions | Success end condition<br>New domain model extension class is defined in the domain Model.<br><br>Failure end condition<br>No domain model extension class is defined.<br><br>Minimal Guarantee<br>None |
| Trigger | 1. New domain model extension object is required/needed by one or more CDM Consumers. |
| Main Flow | 1. Create a java class for the new domain model extension class.<br>2. Define the java class to extend the appropriate class. This class should be extended (java inheritance) from one of the CDMR base classes or a class that has one of the CDMR base classes in its path.<br>3. Define the java class to implement all of the appropriate interfaces. These interfaces should be from the set of CDMR base interface classes or an interface that is extending one of the CDMR base interface classes.<br>4. Define any additional properties and additional methods for this class.<br>5. Identify if the class or if any of its properties are temporal.<br>6. Define any relationships with other domain model classes.<br>7. Define the relationship between this extension class and the domain model class that this class is extending (providing additional details or another perspective). |
| Alternate Flows | None |
| Assumptions | None |
| Exceptions | None |
| Variations | None |
| Notes and Issues | None |

FIGURE 11 C

8.3.3.29.1 UD-DO-0270-1 User Defined Property (UDP) for Servers

| | |
|---|---|
| Description | Define a User Defined Property (UDP) for Servers |
| Actors | Application, service, API or other System Actor |
| Pre-Conditions | None |
| Post-Conditions | Success end condition<br>1. Existence of the new property "Color" is recorded in the Domain Model and associated with the "Server" class.<br>2. Data type for the new property is recorded<br>3. Any future instantiation of a "Server" will include this property ("Color")<br><br>Failure end condition<br>Exception is returned<br><br>Minimal Guarantee<br>None |
| Trigger | 1. An application, service, integration interface, API or other system actor needs to record a new property for all servers currently instantiated and to be instantiated in the Domain Model |
| Main Flow | 1. Actor specifies an existing class (Server in this case), the new property name ("Color") and the new property type.<br>2. Actor initiates the create property operation. |
| Alternate Flows | 1. Property named "Color" already defined at step 2.<br>   a. No new property is recorded and an exception is returned. |
| Assumptions | 1. This process can be used to define a UDP for any domain class, not just servers. |
| Exceptions | 1. As described in "Alternate Flows" |
| Variations | None |

FIGURE 11 D

8.3.3.28.1 UC-DO-0260-1 - Define a New User Defined Class

| | |
|---|---|
| Description | Define a User Defined Class (UDC) |
| Actors | Application, service, API or other System Actor |
| Pre-Conditions | None |
| Post-Conditions | Success end condition<br>1. Existence of the new class is recorded in the Domain Model together with its properties.<br><br>Failure end condition<br>Exception is returned<br><br>Minimal Guarantee<br>None |
| Trigger | 1. An application, service, integration interface, API or other system actor needs to record a new class to be instantiated in the Domain Model |
| Main Flow | 1. Actor specifies the description of the new class.<br><br>2. Actor initiates the create class operation. |
| Alternate Flows | 1. Class by the provided name already defined at step 2<br>   a. No new class is recorded and an exception is returned. |
| Assumptions | None |
| Exceptions | 1. As described in "Alternate Flows" |
| Variations | None |
| Notes and Issues | None |

FIGURE 11 E

8.2.5.1 UC-CDMR-DB-0001 -- Database choice at Install

| | |
|---|---|
| Description | Database choice at Install.<br><br>Product Installer selects the type and configuration of the database that is to be used by the product, including the CDM. |
| Actors | Product Installer |
| Pre-Conditions | Appropriate server hardware is available and accessible for performing an install of the product.<br><br>External database is operation, accessible and supported if it is inteded to be used as the database for the product being installed. |
| Post-Conditions | Success end condition<br>Product is installed and operating with the selected type and configuration of the database.<br>Failure end condition<br>roduct is not installed.<br>Minimal Guarantee<br>None |
| Trigger | 1. Product needed by customer. |
| Main Flow | 1. Installation of product started.<br>2. Product Installer is presented a set of choices to determine if a local or remote database is to be used and the type of database.<br>3. Configuration information related to the database being used is maintained for later use.<br>4. Installation completes and the local or remote database is configured as needed by the installer.<br>5. Product is started.<br>6. CDMR leverages the configuration information that is maintained from the installation to determine the set of files (mapping and other database access files) to be used to work with the type of database selected. |
| Alternate Flow | Installation fails at step 1, 2, or 4<br>1. Product not installed and Product Installer informed of problem. |
| Assumptions | None |
| Exceptions | None |
| Variations | None |
| Notes and Issues | None |

FIGURE 11F

8.2.6.1 UC-CDMR-OM-0001 -- Object Promotion

| | |
|---|---|
| Description | Object Promotion<br><br>CDM Consumer promotes an object from a less specialized domain model class to a more specialized domain model class. |
| Actors | CDM Consumer |
| Pre-Conditions | The Device domain model class is a more specialize class than PhysicalObject<br><br>An instance of a PhysicalObject already exists and it is identified as MyObject<br><br>CDM Consumer already has the Device Data Access Object (DAO) class |
| Post-Conditions | <u>Success end condition</u><br>MyObject is promoted from a PhysicalObject to a Device<br><br><u>Failure end condition</u><br>MyObject is not promoted and is still a PhysicalObject.<br><br><u>Minimal Guarantee</u><br>None |
| Trigger | 1. CDM Consumer determines that MyObject is actually a Device rather than a PhysicalObject. |
| Main Flow | 1. CDM Consumer creates a instance of a Device class.<br>2. CDM Consumer populates the new Device class with the desired values from the PhysicalObject class and updates any additional Device properties as needed.<br>3. CDM Consumer makes the appropriate calls to methods to complete the promotion of the PhysicalObject to a Device. These methods are provided by the CDMR but may be overwritten by the Domain Model to perform additional processing needed for promotion.<br>4. CDM Consumer calls the appropriate method of the DAO with the object to be promoted and persisted.<br>5. CDMR persist the changes to the database. |
| Alternate Flows | Database access failed in step 5<br>1. No change is recorded and exception is returned. |
| Assumptions | None |
| Exceptions | Database access failed |
| Variations | None |
| Notes and Issues | None |

FIGURE 11G

8.2.6.2 UC-CDMR-OM-0002 -- Object Merging

| | |
|---|---|
| Description | Object Merging<br><br>CDM Consumer identifies two or more object instances that represent the same real world object and merges these instances into a single instance (removes/consoldiates duplicates). |
| Actors | CDM Consumer |
| Pre-Conditions | N (2 or more) instances identified as MyObject1....MyObjectN that are of type Device.<br><br>CDM Consumer already has the Device Data Access Object (DAO) class. |
| Post-Conditions | Success end condition<br>MyObject1 is keep with some updates from the other objects (MyObject2....MyObjectN) and these are deleted.<br>Failure end condition<br>MyObject1....MyObjectN are not merged, no changes to these objects.<br>Minimal Guarantee<br>None |
| Trigger | 1. CDM Consumer determines that MyObject 1....MyObjectN represent the same real world device. |
| Main Flow | 1. CDM Consumer determines which object is to exist after the merge and which ones are to be deleted -- MyObject1 is to exist. MyObject2 ....MyObjectN are to be deleted.<br>2. CDM Consumer updates MyObject1 with any updates that are needed from MyObject2....MyObjectN. Usually though input from the user.<br>3. CDM Consumer makes the appropriate calls to methods to complete the merging of the objects. These methods are provided by the CDMR but may be overwritten by the Domain Model to perform additional processing needed for merging. These methods also handle the merging of the extensions as well and deleting of the duplicates.<br>4. CDMR persist the changes to the database. |
| Alternate Flows | Database access failed in step 4.<br>1. No change is recorded and exception is returned. |
| Assumptions | None |
| Exceptions | Database access failed |
| Variations | None |
| Notes and Issues | None |

FIGURE 11H

8.2.7.1 UC-CDMR-DI-0001 -- Cascading Delete

| | |
|---|---|
| Description | Cascading Delete<br><br>CDM Consumer deletes a domain model object and the appropriate set of associated domain model objects is deleted. Domain model objects that are dependent on the existence of the domain model object that is deleted are deleted as well. |
| Actors | CDM Consumer |
| Pre-Conditions | CDM Consumer already has the Data Access Object (DAO) for the type of object that is being deleted. |
| Post-Conditions | <u>Success end condition</u><br>Object and appropriate associated objects are deleted.<br><br><u>Failure end condition</u><br>No objects are deleted.<br><br><u>Minimal Guarantee</u><br>None |
| Trigger | 1. CDM Consumer is deleting an object from the system |
| Main Flow | 1. CDM Consumer calls the appropriate method of the DAO with the object to be deleted.<br>2. CDMR leverages the annotations used to define the domain model class to determine the appropriate associated objects that need to be deleted along with the requested object. The CDMR also identifies any associated objects that need to be updated, such as removing references to the deleted object(s).<br>3. CDMR persist the deletes and updates to the database. |
| Alternate Flows | Database access failed in step 3<br>1. Problem accessing database and exceptions is returned. |
| Assumptions | None |
| Exceptions | Database access failed |
| Variations | None |
| Notes and Issues | None |

FIGURE 11I

8.2.8.1 UC-CDMR-CC-0001 -- Multiple Updates

| | |
|---|---|
| Description | Multiple Updates <br><br> CDM Consumer attempts to update an object |
| Actors | CDM Consumer |
| Pre-Conditions | CDM Consumer already has the Data Access Object (DAO) for the type of object that is being manipulated. <br><br> CDM Consumer already has an instance of the object that is being manipulated. |
| Post-Conditions | <u>Success end condition</u> <br> Changes related to the object are persisted in the database. <br><br> <u>Failure end condition</u> <br> Changes related to the object are not persisted in database. <br><br> <u>Minimal Guarantee</u> <br> None |
| Trigger | 1. CDM Consumer is updating an object. |
| Main Flow | 1. Another CDM Consumer updates the object successfully. <br> 2. CDM Consumer calls the update method of the DAO with the object that the consumer already retrieved prior to the other CDM Consumer making an update. <br> 3. CDMR verifies that the object has not been previously damaged by checking the version filed. If the version field is different, then the object has been modified by another consumer, if the same then not changes have been made. <br> 4. CDMR persist the changes to the database. <br><br> Concurrency check failed in step 3 <br>     1. No change is recorded and exception is returned. |
| Alternate Flows | Database access failed in step 4 <br>     1. No change is recorded and exception is returned. |
| Assumptions | None |
| Exceptions | Concurrency error. Database access failed |
| Variations | None |
| Notes and Issues | None |

FIGURE 11J

8.2.9.1 UC-CDMR-OI-0001 -- Adding Object with Unique Id

| | |
|---|---|
| Description | Adding Object with Unique Id<br><br>CDM Consumer adds an object to the system and the CDM assigns a unique identifier to the object. |
| Actors | CDM Consumer |
| Pre-Conditions | CDM Consumer already has the Data Access Object (DAO) for the type of object that is being added. |
| Post-Conditions | <u>Success end condition</u><br>Object is persisted in the database with a unique identifier<br><br><u>Failure end condition</u><br>Object is not persisted into the database<br><br><u>Minimal Guarantee</u><br>None |
| Trigger | 1. CDM Consumer is adding an object to the system |
| Main Flow | 1. CDM Consumer creates the object.<br><br>2. CDM Consumer calls the appropriate method of the DAO with the object to be saved.<br><br>3. CDMR generates a unique id for the object being saved.<br><br>4. CDMR persist the changes to the database. |
| Alternate Flows | Database access failed in step 4<br>    1. No change is recorded and exception is returned. |
| Assumptions | None |
| Exceptions | Database access failed |
| Variations | None |
| Notes and Issues | None |

FIGURE 11K 8.2.10.1 UC-CDMR-AE-0001 -- Change Objects with Authorization Enforcement

| | |
|---|---|
| Description | Changing Objects with Authorization Enforcement<br><br>CDM Consumer changes (creates, updates, or deletes) an object for a specific user |
| Actors | CDM Consumer |
| Pre-Conditions | Authorization information is configured for the object that is being manipulated by the CDM Consumer.<br><br>CDM Consumer already has the Data Access Object (DAO) for the type of object that is being manipulated. |
| Post-Conditions | Success end condition<br>Changes related to the object are persisted in the database<br><br>Failure end condition<br>Changes related to the object are not persisted in database<br><br>Minimal Guarantee<br>None |
| Trigger | 1. CDM Consumer is changing an object. |
| Main Flow | 1. CDM Consumer changes (create, update, or delete) the object<br>2. CDM Consumer calls the appropriate method of the DAO with the object and provides the specific user associated with the change<br>3. CDMR retrieves the necessary authorization enforcement information from the CPS authorization service(s)<br>4. CDMR verifies that the specified user is able to manipulate the object (authorization enforcement)<br>5. CDMR persist the changes to the database |
| Alternate Flows | Authorization validation check failed in step 4<br>1. No change is recorded and exception is returned.<br><br>Database access failed in step 5<br>1. No change is recorded and exception is returned. |
| Assumptions | None |
| Exceptions | Permission denied. Database access failed |
| Variations | None |
| Notes and Issues | None |

FIGURE 11L

8.2.10.2 UC-CDMR-AE-0002 -- Retrieving Objects with Authorization Enforcement

| Description | Retrieving Objects with Authorization Enforcement<br><br>CDM Consumer retrieves object(s) for a specific user. |
|---|---|
| Actors | CDM Consumer |
| Pre-Conditions | Authorization information is configured for the objects that are being retrieved by the CDM Consumer.<br><br>CDM Consumer already has the Data Access Object (DAO) for the type of object that is being retrieved. |
| Post-Conditions | Success end condition<br>Object or objects matching the filter criteria that the user has appropriate permissions are returned.<br><br>Failure end condition<br>No objects are returned<br><br>Minimal Guarantee<br>None |
| Trigger | 1. CDM Consumer is retrieving object(s) |
| Main Flow | 1. CDM Consumer calls the appropriate find method of the DAO with any filter criteria and provides the specific user associated with the request<br>2. CDMR retrieves the necessary authorization enforcement information from the CPS authorization service(s)<br>3. CDMR executes the approriate queries to retrieve the object(s) matching the provided filter criteria and the specific user and returns the matching object(s) that the specific user has necessary permissions. |
| Alternate Flows | Database access failed in step 3<br>1. No objects found and exception is returned. |
| Assumptions | None |
| Exceptions | Database access failed |
| Variations | None |
| Notes and Issues | None |

FIGURE 11M

8.2.11.1 UC - CDMR-TE-0001 -- Change Objects with Tenancy Enforcement

| | |
|---|---|
| Description | Changing Objects with Tenancy Enforcement <br><br> CDM Consumer changes (creates, updates, or deletes) an object for a specific tenant |
| Actors | CDM Consumer |
| Pre-Conditions | CDM Consumer already has the Data Access Object (DAO) for the type of object that is being manipulated. |
| Post-Conditions | Success end condition <br> Changes related to the object are persisted in the database <br><br> Failure end condition <br> Changes related to the object are not persisted in database <br><br> Minimal Guarantee <br> None |
| Trigger | 1. CDM Consumer is changing an object for a specific tenant. |
| Main Flow | 1. CDM Consumer determines the specific tenant for changes. <br> 2. CDM Consumer changes (create, update, or delete) the object. <br> 3. CDM Consumer calls the appropriate method of the DAO with the object and provides the specific tenant associated with the change. <br> 4. CDMR retrieves the necessary tenant enforcement information from the CPS tenant service(s). <br> 5. CDMR verifies that the CDM Consumer is able to manipulate members of the specified tenant (tenancy enforcement). <br> 6. CDMR persist the changes to the database for the specified tenant. |
| Alternate Flows | Tenancy validation check failed in step 5 <br> 1. No change is recorded and exception is returned. <br><br> Database access failed in step 6 <br> 1. No change is recorded and exception is returned. |
| Assumptions | None |
| Exceptions | Permission denied.  Database access failed |
| Variations | None |
| Notes and Issues | None |

FIGURE 11N

8.2.11.2 UC-CDMR-TE-0002 -- Retrieving Objects with Tenancy Enforcement

| | |
|---|---|
| Description | Retrieving Objects with Tenancy Enforcement<br><br>CDM Consumer retrieves object(s) within a specific tenant. |
| Actors | CDM Consumer |
| Pre-Conditions | CDM Consumer already has the Data Access Object (DAO) for the type of object that is being retrieved. |
| Post-Conditions | Success end condition<br>Object or objects matching the filter criteria within the specified tenant are returned<br><br>Failure end condition<br>No objects are returned<br><br>Minimal Guarantee<br>None |
| Trigger | 1. CDM Consumer is retrieving object(s) within a specific tenant |
| Main Flow | 1. CDM Consumer determines the specific tenant for changes.<br>2. CDM Consumer calls the appropriate find method of the DAO with any filter criteria and provides the specified tenant.<br>3. CDMR retrieves the necessary tenant enforcement information from the CPS tenant service(s).<br>4. CDMR executes the appropriate queries to retrieve the object(s) matching the provided filter criteria that are within the specified tenant and returns the matching object(s). |
| Alternate Flows | Database access failed in step 4<br><br>1. No objects found and exception is returned. |
| Assumptions | None |
| Exceptions | Database access failed |
| Variations | None |
| Notes and Issues | None |

FIGURE 110

8.2.12.1 UC-CDMR-TM-0001 -- Change Temporal Objects

| | |
|---|---|
| Description | Changing Temporal Objects<br><br>CDM Consumer changes (creates, updates, or deletes) an object at specified time (current or in the future). |
| Actors | CDM Consumer |
| Pre-Conditions | CDM Consumer already has the Data Access Object (DAO) for the type of object that is being manipulated. |
| Post-Conditions | Success end condition<br>Change related to the object are persisted in the database<br><br>Failure end condition<br>Changes related to the object are not persisted in database<br><br>Minimal Guarantee<br>None |
| Trigger | 1. CDM Consumer is changing an object for a specific time. |
| Main Flow | 1. CDM Consumer determines the desired time for the change (current or future time)<br>2. CDM Consumer changes (create, update, or delete) the object.<br>3. CDM Consumer executes validations to ensure that the change is consistent with the state at the specified time, and all future times affected by the change. For example, if changing the name of an object, there are no duplicate names at the specified time or in the future.<br>4. CDM Consumer calls the appropriate method of the DAO with the object and provides the specific time associated with the change (current or future time).<br>5. CDMR persist the changes to the database for the specified time. |
| Alternate Flows | Validation checks failed in step 3<br>   1. No change is recorded and exception is returned.<br><br>Database access failed in step 5<br>   1. No change is recorded and exception is returned. |
| Assumptions | None |
| Exceptions | Validate checks failed. Database access failed |
| Variations | None |
| Notes and Issues | None |

FIGURE 11P

8.2.12.1 UC-CDMR-TM-0002 — Retrieving Temporal Objects

| | |
|---|---|
| Description | Retrieving Temporal Objects<br><br>CDM Consumer retrieves the state of an object(s) at a specific point in time (past, current, future). |
| Actors | CDM Consumer |
| Pre-Conditions | CDM Consumer already has the Data Access Object (DAO) for the type of object that is being retrieved. |
| Post-Conditions | <u>Success end condition</u><br>Object or objects matching the filter criteria at the requested time are returned<br><br><u>Failure end condition</u><br>No objects are returned<br><br><u>Minimal Guarantee</u><br>None |
| Trigger | 1. CDM Consumer is retrieving object(s) for a specific time |
| Main Flow | 1. CDM Consumer determines the desired time for the state of object(s) to be returned (past, current, or future)<br><br>2. CDM Consumer calls the appropriate find method of the DAO with any filter criteria and provides the specific time that indicates the state of the object(s) being requested (past, current, or future)<br><br>3. CDMR executes the appropriate queries to retrieve the object(s) matching the provided filter criteria at the specified point in time and returns the matching object(s) |
| Alternate Flow | Database access failed<br><br>1. No objects found and exception is returned. |
| Assumptions | None |
| Exceptions | Database access failed in step 3 |
| Variations | None |
| Notes and Issues | None |

FIGURE 11Q

8.2.13.1 UC-CDMR-SA-0001 -- Changing Objects with a Staging Area

| | |
|---|---|
| Description | Changing Objects within Staging Area<br><br>CDM Consumer changes (adds, updates, or deletes) an object in a specific staging area. |
| Actors | CDM Consumer |
| Pre-Conditions | Staging area exists. |
| Post-Conditions | Success end condition<br>Changes related to the object are persisted in the database in the specific staging area<br><br>Failure end condition<br>Changes related to the object are not persisted in database<br><br>Minimal Guarantee<br>None |
| Trigger | 1. CDM Consumer is changing an object in a specific staging area |
| Main Flow | 1. CDM Consumer makes the appropriate calls to methods of the CDMR to make changes to the object in the specific staging area. These changes may be the addition existing or new objects to the staging area, modifying or deleting objects in the staging area.<br>2. CDMR records the necessary information to allow the object to be manipulated in the staging area without impacting the actual object that is in the current area.<br>3. CDMR persist the changes to the database |
| Alternate Flows | Database access failed in step 3<br>1. No change is recorded and exception is returned. |
| Assumptions | None |
| Exceptions | Database access failed |
| Variations | None |
| Notes and Issues | None |

FIGURE 11R

8.2.13.2 UC-CDMR-SA-0002 -- Committing Objects in Staging Area

| | |
|---|---|
| Description | Committing Objects in Staging Area<br><br>CDM Consumer commits changes in the staging area to be applied to the current objects. These committed changes then become part of the active/current set of objects. |
| Actors | CDM Consumer |
| Pre-Conditions | Staging area exists with changes to objects. |
| Post-Conditions | <u>Success end condition</u><br>Changes are committed to the current/active objects from the staging area in the database<br><br><u>Failure end condition</u><br>Changes are not committed and are left in the staging area<br><br><u>Minimal Guarantee</u><br>None |
| Trigger | 1. CDM Consumer is committing changes made in the staging area to the active/current staging area. |
| Main Flow | 1. CDM Consumer identifies the set of objects with changes that are to be committed from the staging area to the current/active objects.<br>2. CDM Consumer makes the appropriate calls to methods of the CDMR to commit these objects from the staging area to the current/active objects.<br>3. CDMR records the necessary information to commit the changes made to the objects in the staging area to the current/active objects.<br>4. CDMR persist the changes to the database. |
| Alternate Flows | Conflicts found in step 3<br>   1. No change is recorded and exception is returned.<br>Database access failed in step 4<br>   1. No change is recorded and exception is returned. |
| Assumptions | None |
| Exceptions | Conflicts found. Database access failed |
| Variations | None |
| Notes and Issues | None |

FIGURE 11S

8.2.14.1 UC-CDMR-NO-0001 -- Notification Registration

| | |
|---|---|
| Description | Notification Registration<br><br>CDM Consumer registers for notifications of domain model changes. |
| Actors | CDM Consumer |
| Pre-Conditions | |
| Post-Conditions | Success end condition<br>CDM Consumer has subscribed/registered for notifications of desired changes<br><br>Failure end condition<br>CDM Consumer not subscribed/reegistered for notifications<br><br>Minimal Guarantee<br>None |
| Trigger | 1. CDM Consumer registers for notifications |
| Main Flow | 1. CDM Consumer determines/defines the set of changes that are of interest in a filter.<br>2. CDM Consumer calls the appropriate methods of the CDMR to register/subscribe for notifications of object changes based on the filter information provided.<br>3. CDMR maintains the registration information and enables notifications of object changes for the CDM Consumer. |
| Alternate Flows | Registration failed in step 3<br>1. Registration failed and exception is returned. |
| Assumptions | None |
| Exceptions | Registration failed |
| Variations | None |
| Notes and Issues | None |

FIGURE 11T

8.2.14.2 UC-CDMR-NO-0002 -- Distribute Notifications

| | |
|---|---|
| Description | Distribute Notifications<br><br>CDM Consumer receives notifications of object changes. |
| Actors | CDM Consumer |
| Pre-Conditions | CDM Consumer registered to receive notifications of object changes. |
| Post-Conditions | Success end condition<br>CDM Consumer receives notifications<br><br>Failure end condition<br>CDM Consumer does not receive notifications that do not match filter<br><br>Minimal Guarantee<br>None |
| Trigger | 1. Changes made to objects of interest for the CDM Consumer |
| Main Flow | 1. Changes made to objects via CDMR<br>2. CDMR creates events to indicate the type of change and identify the object that is changed<br>3. CDMR publishes the event for all registered consumers<br>4. CDMR notifies consumers of events that match consumers filter criteria specified at registration |
| Alternate Flow | None |
| Assumptions | None |
| Exceptions | None |
| Variations | None |
| Notes and Issues | None |

FIGURE 11U

8.2.15.1 UC-CDMR-SE-0001 -- Serialize Object

| | |
|---|---|
| Description | Serialize Object<br><br>CDM Consumer requires object(s) to be serialized to XML. |
| Actors | CDM Consumer |
| Pre-Conditions | CDM Consumer has the object(s) that need to be serialized |
| Post-Conditions | <u>Success end condition</u><br>Serialized objects are provided to CDM Consumer<br><br><u>Failure end condition</u><br>Objects are not serialized for CDM Consumer<br><br><u>Minimal Guarantee</u><br>None |
| Trigger | 1. CDM Consumer requires objects to be serialized |
| Main Flow | 1. CDM Consumer indentifies the set of objects to be serialized.<br>2. CDM Consumer calls the appropriate methods of the CDMR to serialize and provides the objects that need to be processed.<br>3. CDMR serializes the objects to XML and returns to the CDM Consumer. |
| Alternate Flows | Serialization failed in step 3<br>1. Problem serializing objects and exception is returned. |
| Assumptions | None |
| Exceptions | Serialization failed |
| Variations | None |
| Notes and Issues | None |

FIGURE 11V

8.2.16.1 UC-CDMR-RP-0001 -- Execute Report

| | |
|---|---|
| Description | Execute Report<br><br>Report is executed/ran and requires data from the CDMR for the content of the report. |
| Actors | CDM Consumer (Report Engine) |
| Pre-Conditions | Report is defined and available for executing/running. |
| Post-Conditions | <u>Success end condition</u><br>Data required by report engine for the report is provided.<br><br><u>Failure end condition</u><br>Data required by report engine for the report is not provided.<br><br><u>Minimal Guarantee</u><br>None |
| Trigger | 1. Report is executed |
| Main Flow | 1. Report engine is running report.<br>2. Report engine/report request data from the CDMR via the driver to retrieve the data required for the report.<br>3. CDMR retrieves the required data from the database and provides to the report engine/report. |
| Alternate Flows | Database access failed in step 3<br>1. Unable to retrieve data and exception is returned. |
| Assumptions | None |
| Exceptions | Database access failed |
| Variations | None |
| Notes and Issues | None |

FIGURE 11W

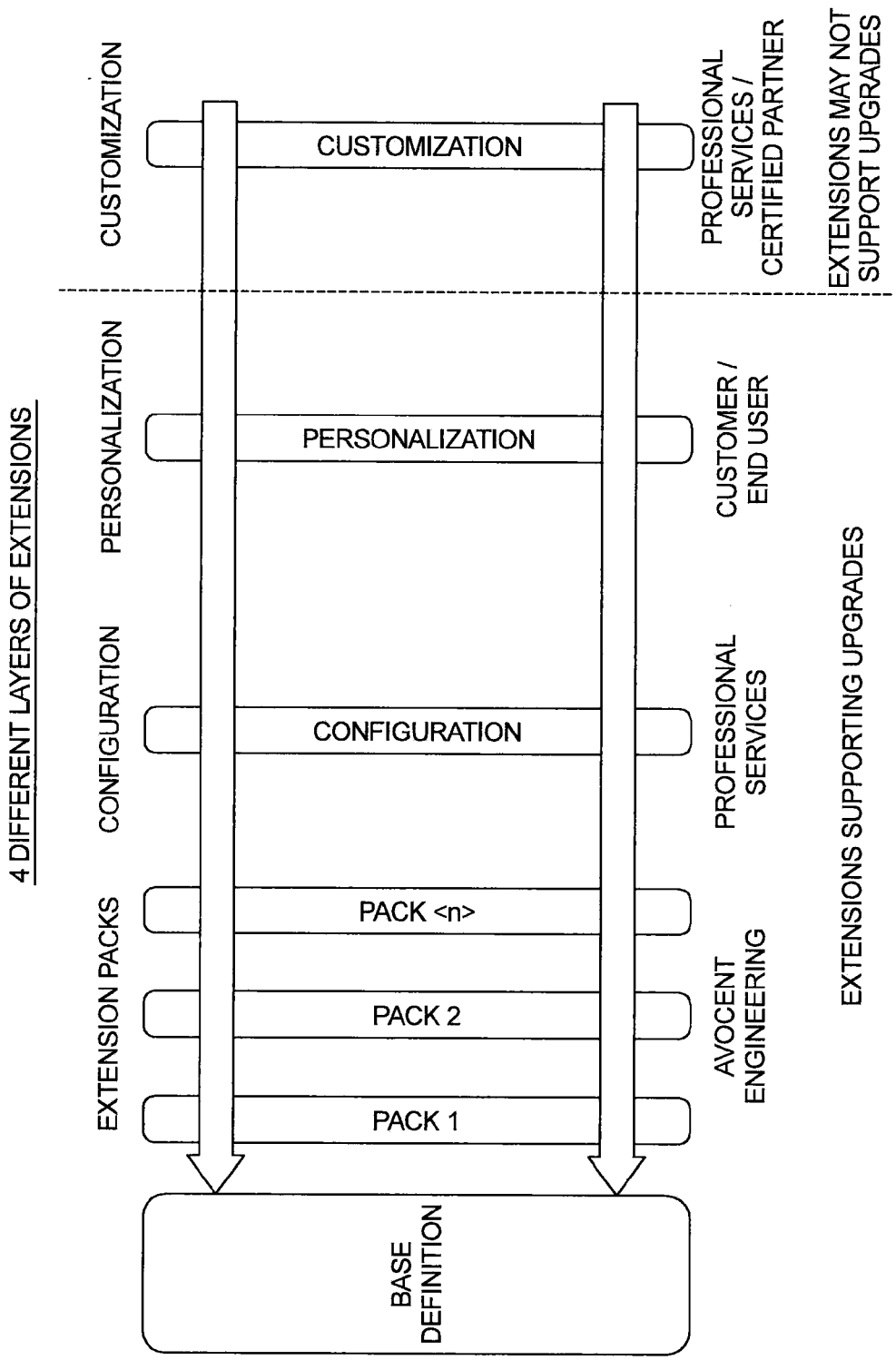

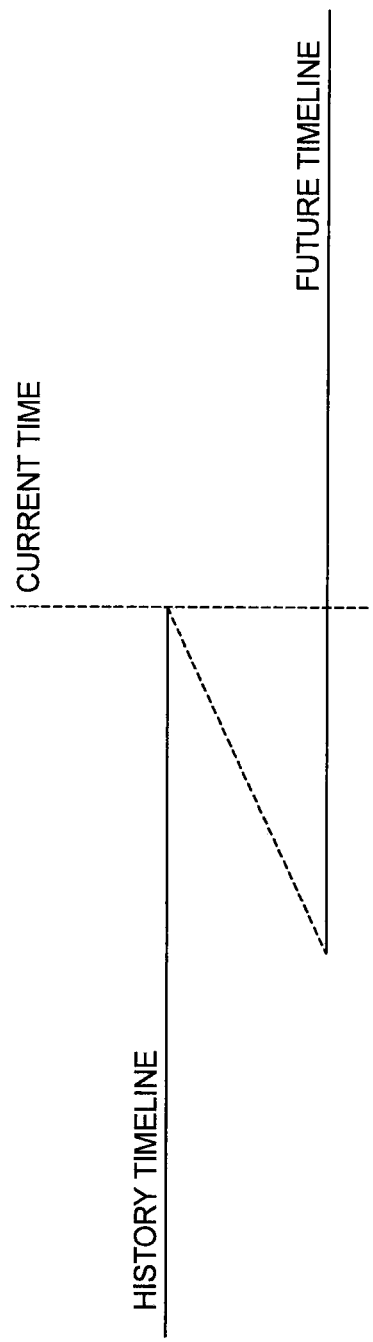

| Function \ Platform | DCIM SP I | DCIM SP II | DCIM SP Logical | DCIM Branch 8 | DCIM Entry | DCIM Enterprise |
|---|---|---|---|---|---|---|
| Com Express | Atom D410 | Atom D410 | Atom D410 | Atom D410 | Atom D410 | i7-620LE |
| Memory | 4GB | 4GB | 4GB | 4GB | 4GB | 8GB |
|  | DDR2 | DDR2 | DDR2 | DDR2 | DDR2 | DDR3 |
| HDD | 250 GB | 250 GB | 250 GB | 250 GB | 250 GB | Dual 2TB |
| Dedicated IP Ports | 24 | 40 | 0 | 0 | 0 | 0 |
| Dedicated Serial Ports | 8 | 8 | 0 | 0 | 0 | 0 |
| Autosensing Ports | 0 | 0 | 0 | 8 | 32 | 40 |
| RDU Functions | None | None | None | E-Link and RS-485 | All | All |
| MSS Features | Yes | Yes | Yes | Yes | Yes | Yes |
| Power Supply Wattage | 125W | 125W | 125W | 125W | 125W | 125W |
| Power Configuration | Single/Dual | Single/Dual | Single/Dual | Single | Single/Dual | Single/Dual |
| Enclosure | Shallow | Shallow | Shallow | Extended | Extended | Extended |

FIGURE 15

SYSTEM AND METHOD FOR MONITORING AND MANAGING DATA CENTER RESOURCES INCORPORATING A COMMON DATA MODEL REPOSITORY

CROSS-REFERENCE TO RELATED APPLICATIONS

This application claims the benefit of U.S. Provisional Application No. 61/389,616 filed on Oct. 4, 2010 and U.S. Provisional Application No. 61/488,431 filed on May 20, 2011. The disclosures of the above applications are incorporated herein by reference.

TECHNICAL FIELD

The present application is directed to systems and methods for managing the infrastructure associated with data centers, and particularly to a common data model repository (CDMR) which provides the storage and access to data represented in a Domain Model of the system.

BACKGROUND

This section provides background information related to the present disclosure which is not necessarily prior art.

The common data center model has gone through many variations since its origins in mainframe computing. As shown in FIG. 1, from distributed computers, to the client/server model, the utilization of virtualized servers, grid consolidation, and most recently the trend toward utility or "cloud" computing, the demands on data centers are always changing and evolving, and the pace of that evolution is increasing as well.

Modern data centers are undergoing a broad transformation, which encompasses technical innovation, operational improvement, new design principles, changes in the data center supply chain, and changes to the relationship between IT and business. Thus, modern data centers are forming increasingly complex environments with many variables that must be taken into account when considering methods to optimize their efficiency. Along with this transformation comes the issue of energy efficiency and resource management, which will be vital to the success and long-term sustainment of these modern data centers. Currently, there exists a gap in information between the data center infrastructure layer (power, cooling, and space) and the information technology ("IT") infrastructure layer (e.g., computing, storage and communications) which is limiting organizations in optimizing efficiency. One example of the layers that form a typical data center is shown in FIG. 2. The ability to maximize efficiency depends upon being able to collect data from all the different components associated with the data center (i.e., IT and infrastructure), and to present the information in a useful way to the system administrators which enables them to make changes when necessary. This ability has come to be referred to among current professionals as "Data Center Infrastructure Management (DCIM)".

The need for a DCIM solution has been brought to light largely by the increase in consolidation and the associated virtualization, which has exposed the aforementioned gap between the IT layer and the infrastructure layer of a modern day data center, and especially the inefficiencies that this gap creates. The gap also poses a dilemma for data center managers: should they sacrifice efficiency by leaving unused capacity (e.g., electrical power capacity or cooling capacity) as a safety net against overloading, or should they use this capacity and increase efficiency at the risk of failure? One principal goal of the present DCIM system and method is to aid the decision-making process by providing accurate and real-time information to the system administrators in a useful and meaningful way. The bridging of the IT/infrastructure gap is crucial as the demands placed on data centers continue to grow into the future. But up until the present time, no suitable solutions have been proposed which can provide sufficient information to system administrators to accomplish the needed real time management of infrastructure resources to meet the changing needs of the IT layer.

SUMMARY

In one aspect the present disclosure relates to a system that forms a base platform that enables a plurality of objects to be used in forming a plurality of different domain models. The system may include a common data model repository having an object relational mapping layer for mapping instances of the objects to persistent storage. The instances of objects may represent information that includes connections and control capabilities for at least certain ones of the instances of objects. The common data model repository may implement the connections and control capabilities in relation to managed elements.

In another aspect the present disclosure relates to a system that forms a base platform that enables a plurality of objects to be used in forming a plurality of different domain models. The system may include a common data model repository having an object relational mapping layer for mapping instances of the objects to persistent storage. The common data model repository may further provide a unified approach to applying a plurality of cross cutting concerns to the instances of objects as the instances of objects are used by different applications associated with different domain models. The common data model repository may implement the plurality of cross cutting concerns in relation to at least one of the instances of objects and managed elements. The plurality of cross cutting concerns may include at least one of authentication, authorization resolution and enforcement, temporality, multi-tenancy checks, and customization enforcement for enforcing user defined constraints for any property of any of said objects.

In still another aspect the present disclosure relates to a system that forms a base platform that enables a plurality of objects to be used in forming a different domain model. The system may include a common data model repository having an object relational mapping layer for mapping instances of the objects to a persistent storage device. The common data model may support at least one of: extending at least one of the objects by adding at least one attribute to the at least one of the objects to form a new extended object; and a new object type that was not initially provided for in the domain model.

In still another aspect the present disclosure relates to a method that enables a base platform to be formed that enables a plurality of objects to be used in forming a plurality of different domain models. The method may include forming a common data model repository having an object relational mapping layer for mapping instances of the objects to persistent storage. The instances of objects may represent information that includes connections and control capabilities for at least certain ones of the instances of objects. The to common data model repository may implement the connections and control capabilities in relation to managed elements.

Further areas of applicability will become apparent from the description provided herein. It should be understood that the description and specific examples are intended for purposes of illustration only and are not intended to limit the scope of the present disclosure.

BRIEF DESCRIPTION OF DRAWINGS

The drawings described herein are for illustrative purposes only of selected embodiments and not all possible implementations, and are not intended to limit the scope of the present disclosure. In the Figures:

FIG. 10A is a UML diagram illustrating examples of various types of classes that may be used to define objects, or characteristics associated with objects, for use by the Domain Model;

FIG. 11 is a table of Use Cases relating to the implementation and operation of the CDMR;

FIGS. 11A through 11W are details of each of the specific Use Cases listed in FIG. 11;

FIG. 12 is a diagram illustrating how different layers of extensions relate to one another and how they may be used together to alter the base functionality of an application;

FIG. 14 is a diagram of a timeline relating to temporality showing how some changes to a Domain Model object and/or its properties may be made in the future while some changes are made in the past.

FIG. 15 is a table of six different configurations for two DCIM platforms, platforms "A" and "B".

DETAILED DESCRIPTION

Figure 1:
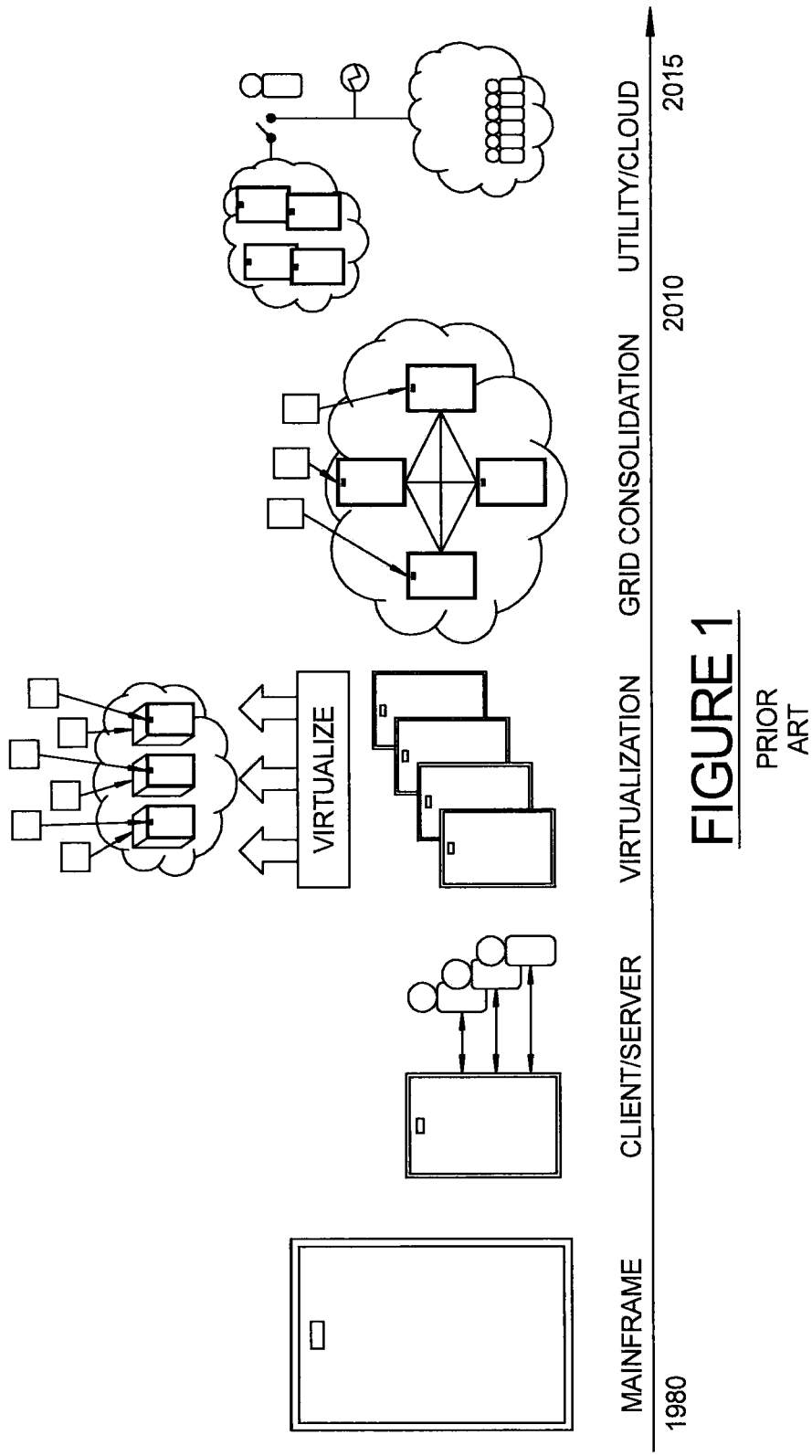
FIG. 1 is a prior art, high level representation of changes that the common data center model has progressed through since its origins in mainframe computing.
Figure 2:
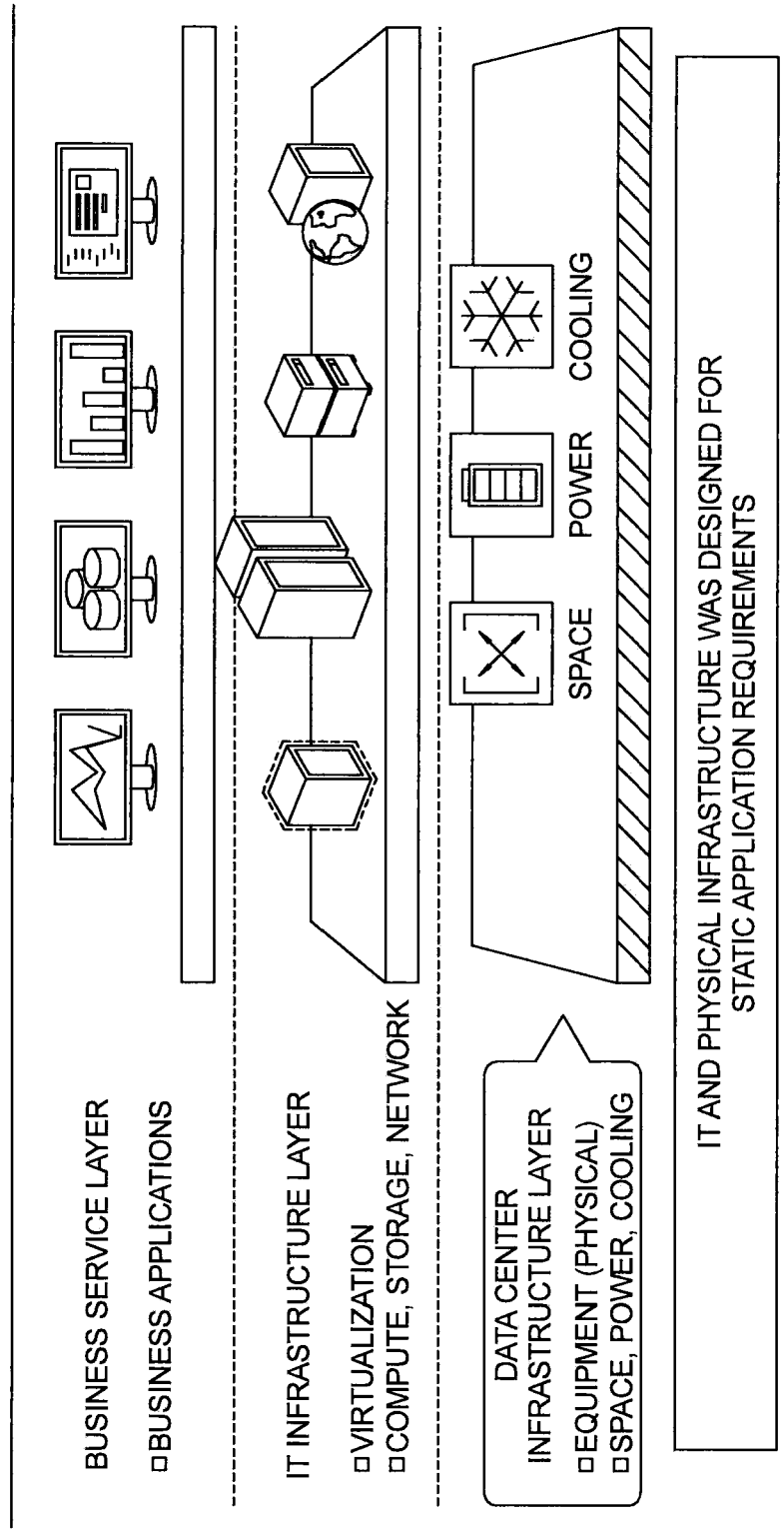
FIG. 2 is a high level representation of one example of the various components that may be used in the various functional layers of a typical, prior art, existing data center.

Example embodiments of a Data Center Infrastructure Management (hereinafter "DCIM") Solution 10 will now be described more fully with reference to the accompanying drawings.

Overview

This section provides a general summary of the disclosure, and is not a comprehensive disclosure of its full scope or all of its features. The DCIM Solution 10 is a modularly expandable family of hardware and software products that are designed to manage all the elements of a datacenter from a central location. In particular, the DCIM Solution 10 includes one or more DCIM hardware appliances (hereinafter simply the "DCIM appliances") and a suite of software products (hereinafter the "DCIM Software Suite"). The DCIM Solution 10 has the capability to manage Microsoft Windows® servers, Linux® servers, UNIX® servers, storage and serial devices, service processors, rack/environmental sensors, data center power units, cooling units, and power distribution units (PDUs), with all data being gathered by a common collection engine. It allows data center operators to have full access to monitor and control every piece of equipment in the data center.

Until now, to manage a data center, multiple point solutions have been needed. The DCIM Solution 10 brings all of these point solutions into a single product suite. Previously, a plurality of independent hardware devices have been required, such as remote access application and associated hardware such as Avocent's KVM appliance to manage Windows® servers; the Avocent® Advanced Console Server (ACS) to manage Linux®/UNIX® servers, serial devices and iPDU; the Avocent® MergePoint™ Service Processor Manager; the Liebert® Rack Data Unit (RDU) to manage rack and environmental sensors, and the Liebert® SiteLink™ communications interface. Previously, a plurality of independent software applications have also been typically been required, such as: the Avocent® MergePoint Infrastructure Explorer data center management software; the Liebert® SiteScan Web centralized monitoring and control system; Emerson Network Power ASCO PowerQuest™ power interface software to monitor power and cooling equipment; and the Aperture® Vista enterprise software solution. By consolidating multiple software appliances into the consolidated software platform that forms the DCIM Software Suite of the DCIM Solution 10, and multiple hardware appliances into the aggregated DCIM hardware appliance, the DCIM Solution 10 not only frees up physical space on an equipment rack, but the operator's span of control of the data center is enhanced. This allows the data center manager to even more effectively manage and control servers and other computing/storage devices, power equipment, and cooling systems to optimize performance and energy usage.

In addition to the obvious benefits that the DCIM appliances provide, the DCIM Software Suite makes managing the datacenter easier and even more efficient than what was previously possible. The software modules that comprise the DCIM Software Suite may run on a common host server apart from the DCIM appliances and may work to provide a complete and accurate view of the data center, while still allowing the user to manage and control every aspect of the data center. The host server receives data from all of the DCIM appliances throughout the data center via their Manageability Subsystem (MSS) collection engines. By using the DCIM Software Suite modules, the data center manager can tap into the real-time data, view reports, and manage the devices remotely from a rich, web-based, graphical user interface ("GUI").

It should also be noted that the DCIM appliances and the DCIM Software Suite can be implemented separately and scaled to fit a user's need. By implementing the DCIM appliances on their own, the user can still access the DCIM appliances remotely, and therefore access the devices connected to them as well. However, the user would not benefit from the reports and enhanced management abilities that the DCIM Software Suite provides. Likewise, the DCIM Software Suite can be implemented in the data center without the DCIM appliances, although without the physical connectivity provided by the DCIM appliances, real-time data collection, monitoring and control are not supported.

DCIM Appliance and DRIP (Hardware)

Figure 3:
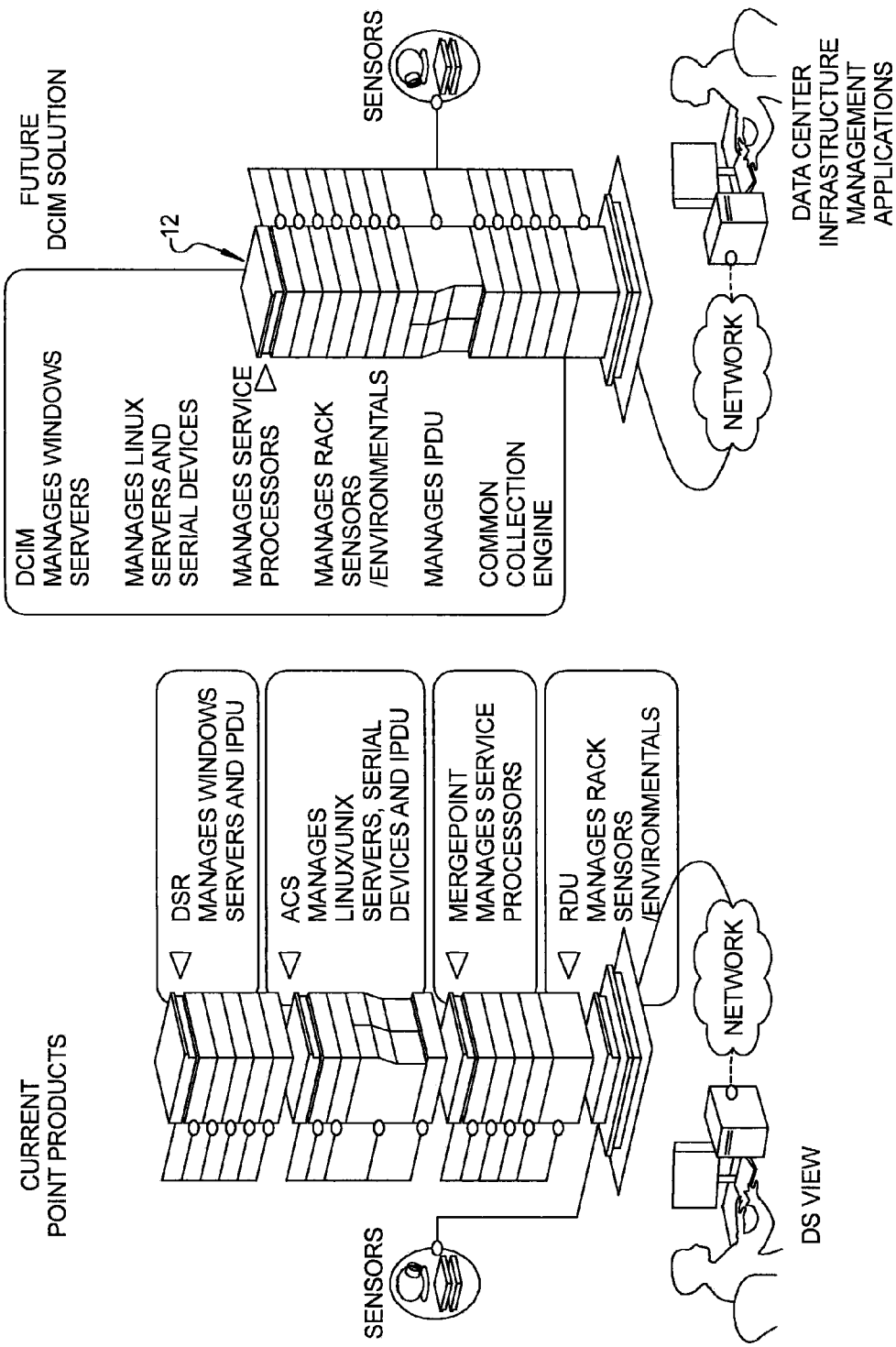
FIG. 3 is a high level representation of one example of a single DCIM appliance in accordance with the present disclosure being used to perform the functions of a plurality of hardware devices.

A DCIM appliance 12 may comprise one or more hardware appliances that typically reside in selected equipment racks or that may be mounted on a wall within a datacenter. The arrangement of interfaces on the DCIM appliance 12 provides the user with access to various pieces of equipment for control and performance metric collection. As illustrated in FIG. 3, the single DCIM appliance 12 consolidates the functions of several previous products into one piece of hardware. The DCIM appliance 12 may replace the existing Avocent® DSR® switches, Avocent® Advance Console Server (ACS), MergePoint Service Process Manager, (SPM), and the Liebert® Rack Data Unit (RDU) products, and consolidate all of their functionality into one or more hardware appliances. A base embodiment of the DCIM appliance 12 termed the "DCIM SP" may replace the existing service process manager (SPM) hardware. The DCIM SP can have at least two specific port configurations, one with 24 IP ports and another with 40 IP. Both versions can include at least eight dedicated serial ports. For each, the IP ports can be isolated from the network interface ports and function as a layer two switch. This arrangement preserves the configuration of the current SPM. The numerous IP ports and the eight dedicated serial ports provide an appliance that can service an entire rack of service processors and also provide control of serial based switches and power strips in the rack. In addition to the two physical port SPM variants, there is a logical version that has only the main network ports and does not have any rear panel ports, the DCIM SP Logical.

In addition to the DCIM SP embodiment, the DCIM appliance 12 may have at least three higher-end embodiments labeled the "DCIM Branch 8", the "DCIM Entry", and the "DCIM Enterprise". This higher-end group of embodiments of the DCIM appliance 12 provides autosensing ports that can automatically select between IP or serial connections. The DCIM Branch 8 does not have RDU connections while the DCIM Entry and DCIM Enterprise devices do. The RDU interfaces on the DCIM Entry and DCIM Enterprise appliances mimic the main connectivity of the RDU appliance and allow similar functions to be included on the higher-end DCIM devices. The higher-end DCIM appliance 12 embodiments may also have the ability to interface with an IQ module providing traditional KVM functionality. This IQ module, called a "Digital Rack Interface Pod" (DRIP), provides digitization of analog video along with keyboard and mouse control and virtual media access.

The key functions of the DRIP are:
Providing USB and PS/2 ports for device keyboard and mouse;
Digitizing analog video data and sending it to the DCIM appliance 12;
Connecting to a server's Service Processor for transmitting IPMI data to the DCIM appliance 12;
Enable access to virtual media; and
Enable Smart Card support.

In order to support the various hardware platforms, an appliance host software platform is provided. The appliance host platform may be based on the Linux® vServer patch and functions as an OS virtualized platform. This allows Linux® operating system based applications to run with minimal changes on top of the DCIM appliance 12 host platform. Building the DCIM appliance 12 in this manner minimizes the changes necessary to combine the individual technologies into a single appliance. It also facilitates groups being able to concentrate on their core function without needing to know the details of the DCIM appliance 12 host platform.

A highly desirable feature of the DCIM appliance 12 software architecture is that it makes the finished devices look like a single cohesive appliance, even though they may be constructed from several underlying disparate software applications. To achieve this, the host system may be set up to provide several system functions that provide a gateway between the external user and the internal guest applications. These include licensing, authentication, authorization and auditing (AAA), and user interfaces. These functions take the external input and map it on to the correct application without the user requiring any knowledge of the underlying architecture. For example when a user authenticates to the DCIM appliance 12, the AAA function may inform each of the guest applications that the user is valid. The user does not need to authenticate to each guest application. Additional host pieces may include things such as the Linux® kernel, base file system and hardware component to driver support. Each of the DCIM appliance 12 may also host a manageability subsystem (MSS) software engine (to be discussed in connection with FIG. 5).

In summary, the six different configurations for two DCIM platforms, platforms "A" and "B", are shown in the table in FIG. 15.

DCIM Software Suite

Figure 4A:
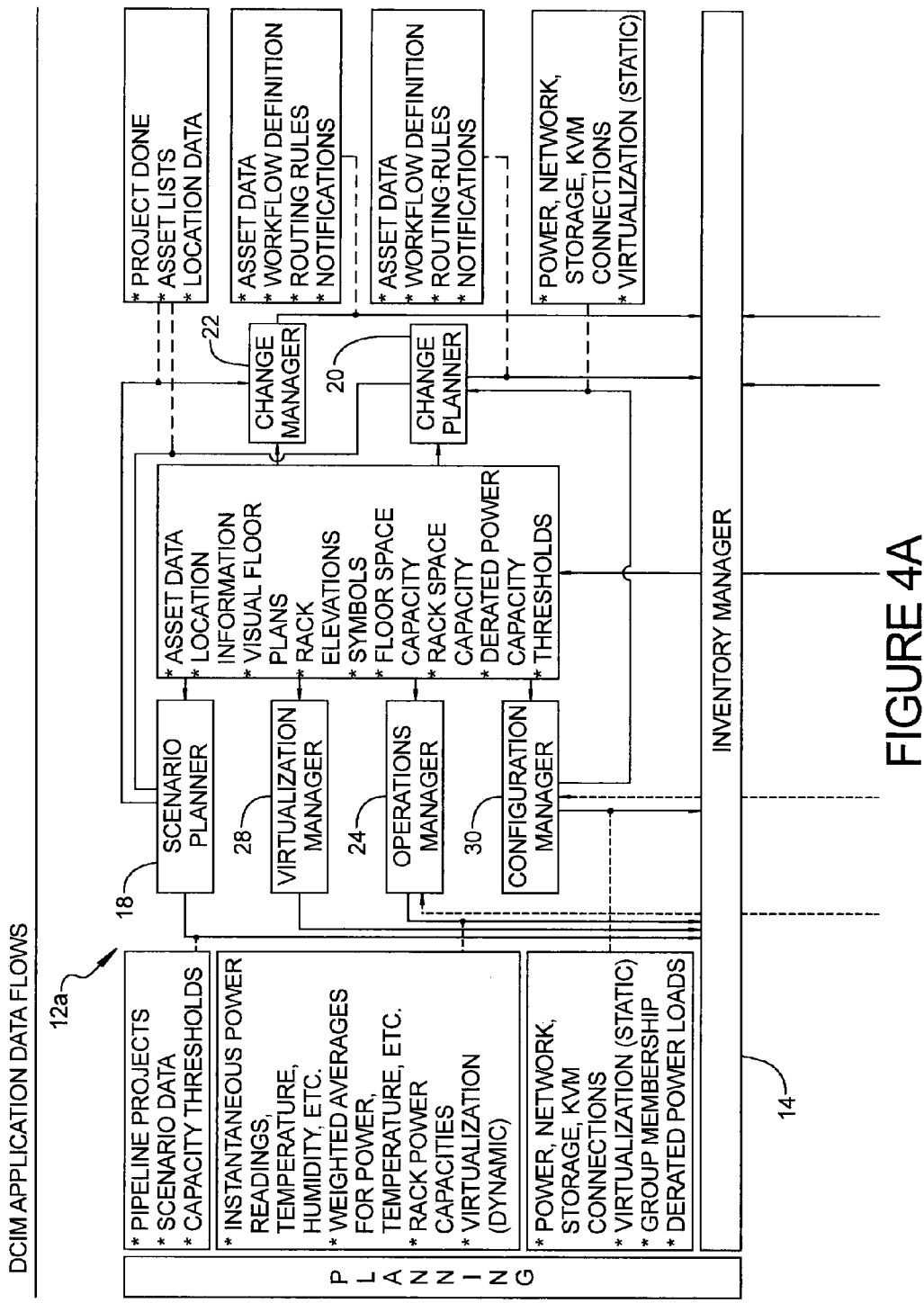
FIG. 4 is a high level diagram of exemplary modules that may be used to form a DCIM Software Suite of one embodiment of a DCIM Solution of the present disclosure.

A DCIM Software Suite 12a of modules is modular, expandable and designed to make the operation, management, configuration or expansion of a datacenter seamless and simple. One example of the DCIM Software Suite 12a of modules is shown in FIG. 4 and may include: an Inventory Manager 14, a Facilities Manager 16, a Scenario Planner 18, a Change Planner 20, a Change Manager 22, an Operations Manager 24, an Event Monitor 26, a Virtualization Manager 28 (and potentially a Rack Power Manager, and a Configuration Manager 30). These modules integrate seamlessly with one another and provide a rich user interface, with the ability to drag and drop items, show high-fidelity images of assets and reported data, and compile user-specific views with combinations of available facilities.

The DCIM Software Suite 12a is flexible enough to accommodate the preferences of the system administrator in a number of different areas, from the operating system and database to the web browser interface. The software modules can be installed on Microsoft® servers, Linux® servers, or Sun® servers, and possibly on other brands of servers. Microsoft® SQL and Oracle® databases are supported. To access the software modules, various commercially available operation systems and web browsers are supported.

For administrators who use existing products of Emerson Network Power or the Avocent® Corporation, for example the Aperture® Vista® data center resource management system, the Liebert® Site Scan® centralized monitoring and control system, or Avocent® MergePoint™ Infrastructure Explorer software (AMIE), the DCIM Software Suite 12*a* supports the migration of data. This data may include all assets and plan data, associated projects, and symbols libraries. The import may be manually triggered but will not necessitate the manual mapping of any asset, placement, plan or project data from AMIE to the modules of the DCIM Software Suite. The individual DCIM Software Suite 12*a* software modules are described in detail in the pages to follow.

DCIM Inventory Manager Module 14

The Inventory Manager module 14 manages DCIM records, which constitute the data center inventory of equipment. Often, data center managers and site technicians manage equipment lists through a variety of means such as spreadsheets, documents, drawing files, finance systems, bills of lading, etc. These are not ideal methods, and tend to be ad-hoc in format, inaccurate, and frequently out-of-date. They also do not provide timely access to information about where physical equipment is located and its purpose. The DCIM Inventory Manager module 14 replaces all of these ad-hoc methods with a system that gives a clear picture of the entire inventory of the data center, with equipment counts of IT assets such as servers and switches, and critical infrastructure equipment like power distribution units ("PDUs") and uninterruptible power supplies ("UPSs"). It allows users to quickly see where equipment is located and gives a gross total of power and space usage.

To do this, the DCIM Inventory Manager module 14 may rely on import software capabilities and specialized views, for example: 1) Import capability to extract equipment records from various sources, and combine information from these sources into a complete data set; 2) Geography Views, which allow users to provide the global location of data center installations and drill down to show more detailed location views, such as campus views, regional views, pictures of buildings, etc.; 3) Textual and Graphical Inventory Lists, which are textual views for "placed" and "un-placed" inventory (items which have not been assigned a location); 4) Data Center Portfolio View, which lists the data centers being managed by the system; 5) Floor Plans and Elevation Views for "placed" inventory (items which have been assigned a location); 6) Workspaces, which allow users to combine graphic and data elements from other views to give them a "dashboard" of critical information which they can reference at a moment's notice; and 7) Layers, which allow users to see information from other applications within the Inventory Manager graphic drawings.

The DCIM Inventory Manager module 14 is able to create, update, and delete all represented objects. These objects include:

IT Spaces—areas where IT equipment is located and housed, and at a more granular level, where equipment is installed.

Floors—areas which contain one or many data center spaces, and correlate to a floor in a building.

Data Centers—areas that are designed to house and run IT equipment. Typical data centers have raised floor spaces as well as dedicated power and cooling equipment.

Spaces—regions of a data center floor in which IT equipment is directly installed. Typical data center spaces have raised floors and racks to house equipment, and are secured from unauthorized entry.

Zones—geographic areas of the data center as defined by the customer, which allow the tabulation of capacity and resource usage within areas of the overall data center. In our definition, a zone is one contiguous space within the data center floor.

Other spaces (walkways, free space)—spaces which, when deducted from the total data center space allow for the calculation of usable data center space.

Enterprise—Information about the Enterprise is tracked to give context for the entire data center portfolio and the teams that manage them. Enterprise information may be tracked at the global level in the software.

IT Equipment—may include all equipment used for the direct purpose of data processing, communications, and storage, and the equipment used to house them. This includes: racks, benches, shelves, data closets; servers, network appliances; symbols, placeholders; and sensor equipment.

Critical Infrastructure—may include all devices, which support the cooling and power distribution for the data center space, including: local utility entrance meters, surge protection devices, transformers, switchgears (HV/MV/LV), generators, uninterruptible power supplies (UPSs), energy storage devices & systems (e.g. batteries, flywheels, fuel cells), power disconnects (e.g. circuit breakers, switches/power-ties), static transfer switches, floor mount PDU systems, power panels, remote power panels, busway power distribution, commando sockets, rack PDU, solar arrays, cooling towers, chillers, pumps, economizers (water/air), floor mount CRAC, in-row CRAC, condensers, heat exchangers, and water reservoirs (tanks).

DCIM Configuration Manager Module 30

The DCIM Configuration Manager module 30 expands the management of DCIM records that are provided by the DCIM Inventory Manager module 14. The DCIM Configuration Manager module 30 consumes the capabilities of the DCIM Inventory Manager module 14, extending them to manage relationships between chosen assets. These relationships may include, without limitation, connections, logical groups and redundancies. To do this, the DCIM Configuration Manager module 30 may incorporate various features, such as:

Connection Views, which allow users to details of the connections between any placed assets. This may include topology, end-to-end trace, dependency and redundancy;

Panel Schedules, which allow users to view details of a panel and the breakers within that panel;

Alerting capabilities, which allow a user to specify a threshold for a plan, group or assets and alert on the consumption against that threshold;

Customizable views, which allow a user to customize the views of the application data that they would like to use and navigate; and Web Services Interface, which allows a user to manipulate the application data from an external software entity.

DCIM Facilities Manager Module 16

The DCIM Facilities Manager module 16 provides complete performance utilization and event management capabilities for critical infrastructure equipment. It provides realistic, virtual views of the equipment and racks on the data center floor and surrounding equipment rooms, as well as underlying electrical one-line schematics of the power system and piping and instrumentation diagrams of the cooling system. It may also provide equipment maintenance features to assist in maintenance tracking, scheduling and equipment commissioning. By providing a system view of power and cooling infrastructure as designed, the DCIM Facilities Manager module 16 allows the user to view the power consumption and cooling capacity (both in-use and stranded) of each device, or at the system level. In addition, it lets the user reserve blocks of load on the power and cooling systems, and project the power and cooling capacity needs into the future, based on historic capacity use.

The Facilities Manager module 16 may provide, both textually and graphically, a number of useful views that allow the user to better understand and manage the data center infrastructure. The DCIM Facilities Manager module 16 may display floor plans, electrical diagrams, air distribution, and piping and instrumentation diagrams. The DCIM Facilities Manager module 16 may provide real-time performance status of individual elements or groups of infrastructure equipment. Each item in the diagram allows the user to initiate the following actions or control operations, if supported by the equipment:

Turn on/off the specific piece of equipment/device (if applicable);
Change user configurable items (e.g. set-points, labels); and
View detailed information for each piece of equipment/device.

In addition to primary view diagrams, the DCIM Facilities Manager module 16 may have at least three separate dashboard views to give the user an overall picture of real time operations in the data center infrastructure. An "Industry Efficiency Dashboard" may display the standard efficiency metrics of the data center's energy consumption (e.g. PUE/DCiE). A "Utilities Consumption Dashboard" may display the total power load (kW), total cooling load, water consumption if applicable, and the overall utilities cost. A "Capacity Dashboard" may display a breakdown of the aggregated capacity of the data center equipment per type (e.g. the current capacity of all floor mount PDUs), as well as a breakdown of the stranded capacity of the data center power and cooling systems.

The DCIM Facilities Manager module 16 also provides significant scalability, for example supporting up to 5000 (or possibly more) critical infrastructure equipment and instrumentation devices, with an approximate number of at least 200 data points each. The equipment data (all parameters other than events) may also be polled at a minimum time interval, for example every five minutes. Some examples of this data may include temperature, percentage load of a UPS, and circuit breaker state just to name a few example metrics.

Scenario Planner Module 18

The DCIM Scenario Planner module 18 provides the ability to build and compare cost effective scenarios of future resource usage in the data center. It may utilize information from data center infrastructure management applications and real world measurements to map an accurate history of resource usage, and project future trends of growth and decline. With the DCIM Scenario Planner module 18, data center managers and capacity planners can determine the best course of action. Whether it means that installations should be decommissioned and consolidated, or new installations be built, the DCIM Scenario Planner module 18 allows the customer to compare and contrast different scenarios of future data center use. The effect of technology updates, increased density within the data center space, upgrades of the critical infrastructure for more efficient energy use, and gauging demand on IT can be compared to build a plan of action that meets service levels at the lowest possible cost. Once the course of action has been determined, the DCIM Scenario Planner module 18 assists in the communication of the plan to management. Software Capabilities that may be included in DCIM Scenario Planner 18 include, without limitation, one or more of the following:

The ability to collect and understand past trends of aggregated global data center infrastructure resources;
The ability to project past aggregated usage trends into the future, to predict base infrastructure needs globally;
The ability to conduct "what-if" scenario planning for infrastructure needs, and to assess the impact of data center moves, adds, decommissions and consolidations; and
The ability to establish a workflow process for project pipeline management, including refinements by technical experts and system owners, and approvals by business managers.

DCIM Change Planner Module 20

The DCIM Change Planner module 20 allows the users to plan and execute changes in the data center infrastructure. To do this, the DCIM Change Planner module 20 may rely on:

Plan views, allowing users to see details of the planned projects;
Timelines, allowing users to see changes planned for a chosen asset throughout the project; and
Alerting capabilities, allowing users to be notified when a task is completed.

The DCIM Change Planner module 20 allows the user to create any number of projects, manage those projects and navigate through them. The user can assign a name, tag, description, target completion date and owner to the project, and can assign individual tasks to the project as well. Once a project has been created its details may be visualized in a calendar format with further details made available for any selected project or tasks. The project can be edited by moving project dates, deleting tasks or adding tasks and the project can be deleted. In addition to specific tasks, the user can assign generic tasks, which do not relate to any particular placed asset in the module. The DCIM Change Planner module 20 also allows the user to assign and view dependencies to other tasks in the project. With the capability to create and manage multiple projects, the possibility arises that there may be conflicts between projects, but the DCIM Change Planner module 20 allows the user to view the conflicts and their severity, and resolve the conflict by changing the parameters of the projects.

Once a project is created and tasks assigned, the DCIM Change Planner module 20 allows the user to view a timeline of the project along with visualizations of the changes associated with any assets affected by the project. The user can see a view of the chosen asset (e.g. a rack), with the assets shown in its various states of change that are scheduled to happen during the lifespan of the project. The DCIM Change Planner module 20 may also display a view of the work to be carried out during a project, colorized by chosen dates, which allows a timeline to show the IT person what is happening on a given date for any chosen assets.

For a given project, the DCIM Change Planner module 20 also allows the user to record all project activity and notify any affected personnel of the activity. A user is notified via email once their designated task or project has been created, edited, has a conflict or is tagged as completed. In addition, the user can create customized reports, import project information in a standard format from an external source, and export project information to PDF or spreadsheet for external use.

DCIM Change Manager Module 22

The DCIM Change Manager module 22 expands the planning and execution capabilities of the DCIM Change Planner module 20 to impose predefined processes or workflows on projects and communicate progress and decisions to project members. To do this, the DCIM Change Manager module 22 may rely on the following software capabilities and specialized views:

- Template Workflow Processes that allow a workflow designer to design and publish workflow processes to be used by future projects.
- Interaction with DCIM modules, which allows the workflow process to interact with DCIM modules to verify that certain required actions have been completed.
- Supports integration with third party IT systems to allow a designer to configure an interface to allow an external source to interrogate the application data and initiate workflow processes.
- Human Interaction in a workflow process, which allows a user to interact with a process that was created from a template.

The DCIM Change Manager module 22 provides the ability to create a project template with user defined high level actions supported by lower level tasks provided by the DCIM Change Planner module 20. Project templates may be used to create projects when needed, where the project may follow the template pre-defined steps to completion. A template may contain, without limitation:

- Pre-defined high level tasks related to the installed Inventory Manager modules (e.g. "Move server" or "Add connection").
- User-defined task categories (e.g. "Move", "Add").
- Trigger points to existing workflow templates.

Once a template is created the user can assign roles for use in the template. The user assigns a name, description, and tag to a role, and can assign other users. The DCIM Change Manager module 22 allows for users to be assigned to multiple roles if necessary. In addition to roles, users can create workflow procedures and assign a name, description and tag to each workflow. Once a workflow is created, steps can be added (whether user defined, or predefined) and specific users or roles can be assigned to each step. To add further detail, the user can define rules, such as entry and exit criteria, to each step. Steps may be linked together to define a progression and sub-processes can be created through certain steps.

Once the user has a workflow set up, he/she can simulate a "run" of the execution to identify any errors and validate the workflow. The user may also want to set up customized notifications for various workflow events. The DCIM Change Manager module 22 allows the user to do this, and will propagate notifications to the participants when a task begins, completes, or when any other workflow event occurs.

DCIM Operations Manager Module 24

The DCIM Operations Manager module 24 combines real-world information with managing the data center infrastructure configuration. It provides interfaces to measure performance and utilization across the data center infrastructure and to reveal current available headroom in racks such that the appropriate placement of equipment can be achieved. The DCIM Operations Manager Module 24 may connect to real time data feeds (for power and temperature) from the MSS service to compare and validate the performance guidelines and design criteria established in the Configuration Manager module 30 capabilities.

The DCIM Operations Manager module 24 may also be used to optimize power, cooling, and space capacity to bring about overall optimization of data center infrastructure resources. The business problem this module solves is around the management of power and cooling. Large buffers of power and cooling are typically maintained by data center managers to protect systems from outage due to power spikes and periods of increased usage. The amount of buffer to reserve is typically not managed efficiently. Reduction of these buffers allows better utilization of resources. For example, more equipment may be located in one or more equipment racks while sufficient power and cooling needs are still met for all equipment items.

One important feature of this product is that it provides a natural and elegant approach to viewing monitored information about the data center—of which there is a large amount generated by many systems in many different formats. The result of crunching all of this data and seeing it in a usable form makes possible a more accurate understanding of the operation of the data center environment, a better understanding of the true cost of energy use, maximization of the investment in the data center, and ensuring continued 24/7 operations for IT.

The software capabilities are inherited from those defined for the DCIM Configuration Manager module 30 and the DCIM Inventory Manager module 14. The DCIM Operations Manager module 24 adds new features to the DCIM Configuration Manager module 30 capabilities as listed herein. There may be, however, additional software facilities defined for the DCIM Operations Manager module 24 such as, without limitation:

- Dashboard for monitoring real-time data feed.
- Additional visualizations to show temperature sensor output, and cooling parameters such as airflow.

DCIM Event Monitor Module 26

The DCIM Event Monitor module 26 provides an easy-to-understand system for managing alarms. It provides a single, unified view to monitor alarms for critical infrastructure equipment across the user's entire enterprise. Relevant information is presented in a simple, graphical manner, making it easy to understand and respond quickly. The DCIM Event Monitor module 26 allows the user to, without limitation:

- Maintain service level agreements (SLA's).
- Keep the business critical IT infrastructure available and online.
- Maintain critical infrastructure system redundancy.
- Acknowledge and verify that actions have taken place.

DCIM Virtualization Manager Module 28

The DCIM Virtualization Manager module 28 provides tools to manage virtual infrastructure in a data center. It helps to map physical machines with virtual machines, manage the virtual machines and group the virtual machines for ease of management. The DCIM Virtualization Manager module 28 may relay the information to the DCIM Operations Manager module 24 for interfacing with virtualization management servers (e.g. VMware Virtual Center Management Server). The DCIM Operations Manager module 24 may then auto-discover host machines and virtual machines, relaying this information back to the DCIM Virtualization Manager module 28. With this information the user is able to specify the synchronization schedule of virtualization infrastructure information between virtualization management and virtualization management servers on periodic, pre-defined time intervals. The user may also initiate synchronization on a demand basis from the DCIM Virtualization Manager module 28.

With the virtualization inventory synchronized, the user is able to view the inventory in a graphical format. The DCIM Virtualization Manager module 28 may depict the virtual machines graphically against the physical inventory or servers to show which virtual machines are housed where. In addition, the DCIM Virtualization Manager module 28 may provide a cluster view (showing the groups of virtual machines in various clusters), a virtual list of servers with associated virtual machines, and a search feature allowing the user to find the specific virtual machine, cluster or server that he/she wants to manage. When the user selects the correct virtual machine, the Virtualization Manager module 28 provides the ability to access the virtual machine console by launching the virtualization provider's Remote Console, a Web browser or a RDP from a virtual machine.

Additional Details of DCIM Solution 10

Figure 5:
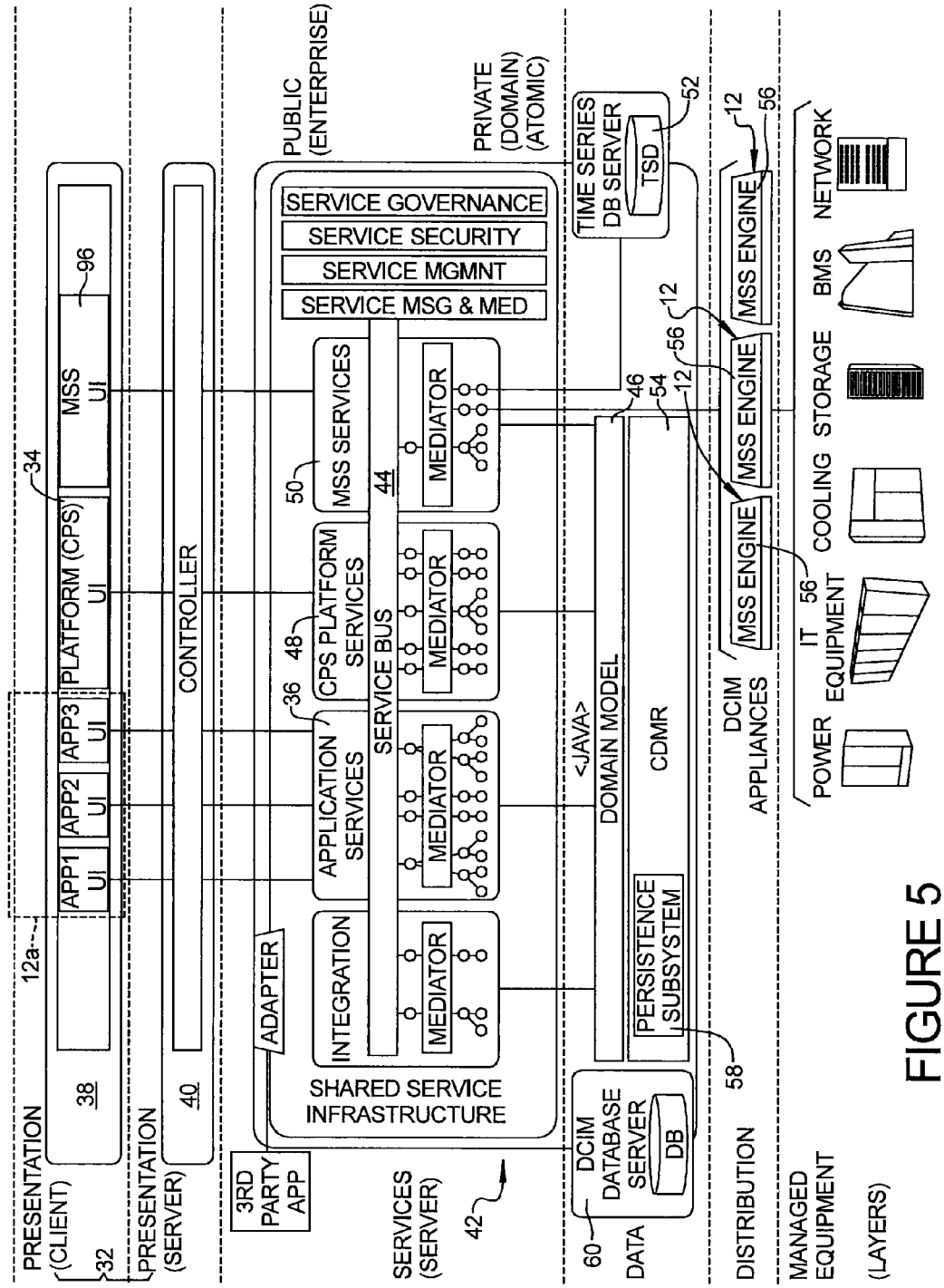
FIG. 5 is a high level diagram of one example of the DCIM Solution architecture.

Referring to FIG. 5, various components of one example of the DCIM Solution 10 can be seen. The architecture of the DCIM Solution 10 may contain the following high level components. Each component will be described in more detail in the discussion below.

Presentation UI 32—These components represent the human interface for individual applications and for the platform. A Common Platform 34 contains a web-based Console Framework that allows individual applications and the platform to plug-in user interface components. The Presentation UI 32 consumes public interfaces exposed by a Services layer 36 that provide the actual business functionality. Logically, the Presentation UI 32 may be broken into two layers: a client layer 38, typically resident within a web browser and representing the "View" in a Model-View-Controller architecture, and a server layer 40, typically representing the Controller.

Enterprise Service Bus (ESB)—An ENP Common Platform 42 contains an Enterprise Service Bus 414 that provides a container for Business Services and provides for intelligent routing of messages between services. The architecture presumes that communications between the Presentation UI 32 layer (specifically, the controller 40) and the ESB 44 may be SOAP/HTTP, although other transports may be used based on specific application design requirements.

Application Services 36—These may be individual and/or composite services that provide product application functionality. A service composition is an aggregate of services collectively composed to automate a particular task or business process. These services 36 can be made up of both private and public services. Public services are exposed on the ESB 44 and available for other applications to consume. These application services 36 may use a Domain Model 46 (for example via Java) to access business objects specific to the product domain.

Common Platform Services 48—These are utility services provided as part of the ENP Common Platform 42 and may be either individual or composite services. The ENP Common Platform 42 provides these services which are likely to be used by any product and may include services such as authentication, authorization and auditing. These services are configurable such that a Product Line Architecture PLA may select which services to include for a given PLA. For maximum extensibility, these services should be data driven such that they are also extensible by adding domain specific knowledge (e.g. a new event type unique to a given domain).

MSS Services 50—These are composite services that provide for management (e.g. Discovery, Data Acquisition, Command & Control) of managed elements (or managed devices) via a distributed real-time framework. MMS (Manageability Subsystem) Services 50 interacts with the DCIM appliances 12 to perform data acquisition and store acquired data in a Time Series Database 52 and a Common Data Model Repository CDMR 54.

Time Series Database (TSD) 52—The time-series database 52 operates to persist telemetry data sent from the MMS Services 50.

DCIM appliance 12—The DCIM appliance 12 (or appliances 12) form a hardware appliance that is the touch point to the managed equipment or managed devices. Each DCIM appliance 12 can be loaded with several software applications including KVM, Serial, Service Processor and an "MSS Engine" 56 for data acquisition.

MSS Engine 56—The MSS Engine 56 may be a software component that can be deployed on each DCIM appliance 12 to acquire metric data and perform management (e.g. Discovery, Data Acquisition, Command & Control) on managed equipment being handled by each DCIM appliance 12. The MSS Engine 56 feeds data to the MSS Services 50 for storage in the Time Series Database 52 and the CDMR 54.

Managed Equipment (or Managed Devices or Managed Components)—Represents an entity (e.g. a "device") that is addressable and can be managed (i.e., controlled in some way) and/or monitored.

Domain Model 46—The Domain Model 46 provides a common definition of domain concepts across all applications (e.g. a shared, extensible library of domain classes that allow for application specific customization). In one example, the Domain Model 46 may be represented as native Java objects. It also delegates manageability knobs and dials type operations to the MSS Services 50.

Common Data Model Repository (CDMR) 54—The CDMR 54 forms a repository that is responsible for creating and persisting the Domain Model objects. The CDMR 54 hides the complexity of initializing domain objects and hides a persistence subsystem 58.

DCIM Datastore 60—A DCIM Datastore 60 may be a SQL database that persists the defined domain objects and other configuration information associated with these domain objects. The DCIM Datastore 60 may be in communication with the persistence subsystem 58.

Integration Services 62—Composite services that are deployed to support integration with $3^{rd}$ Party Applications.

$3^{rd}$ Party Applications—External applications that can be integrated with the ENP Common Platform 42 (e.g., Hewlett-Packard OpenView software, CiscoWorks LAN management solution tools, the EMC Corporation EMC Smarts Application Discovery Manager (ADM)).

Technology Alliances—development of key technology alliances (internal to Emerson and external) to tightly integrate and enable a closed loop control system. Technical alliances with:

Emerson Network Power Products: Liebert Power and Cooling products to embed DCIM components to within managed devices and elements allow discovery, monitoring and control of various Liebert products.

External technology alliances (for example: Cisco, EMC and Vmware to embed DCIM components in managed devices and elements to provide detailed information on server workloads and integrate Power & Cooling consumption.

All components can be deployed on the same server, but the DCIM Solution 10 is flexible enough to allow major components to be placed on separate servers (e.g. Client, Application Server, Database Server, Report Server, etc.) for scalability and redundancy purposes.

The following is a further discussion of various components of the DCIM Solution 10.

Domain Model/CDMR

Figure 6:
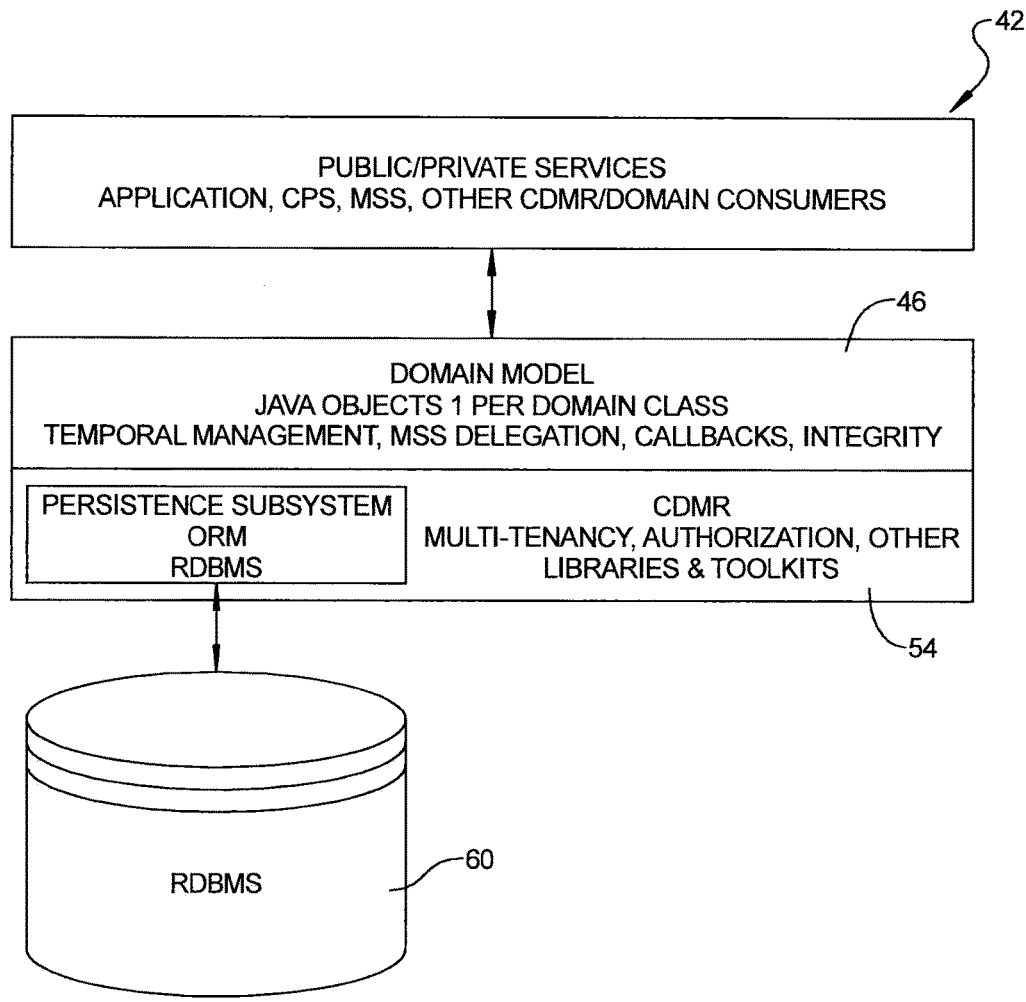
FIG. 6 is a high level diagram of showing the relationship between the Public/Private services and the DCIM Solution's Domain model and CDMR.

Referring to FIG. 6, the Domain Model 46 may be viewed as a collection of Java classes that represent data center infrastructure entities—and the context in which those entities exist. In addition, the Domain Model 46 may represent users, software licenses and other associated data center infrastructure management (DCIM) entities. These can be viewed as the "facts". These facts are used by applications and services.

A common data model may be shared across all of the DCIM application modules 14-30. Individual products often extend the DCIM product line's shared, common data model. The CDMR 54 maps Java class instances to persistent storage (in a relational database, such as the DCIM datastore 60), enforces authorization, segregates tenants, checks integrity constraints, etc. A variety of cross-cutting concerns can be addressed by the CDMR 54.

The Domain Model 46 is the collection of domain classes used to represent entities (under management), relationships amongst entities, and policies about entities and so on. The Domain Model 46 establishes the conventions for representing all of the known 'facts' within the DCIM domain. Then, these 'facts' are shared across all products within the DCIM product line.

Figure 7:
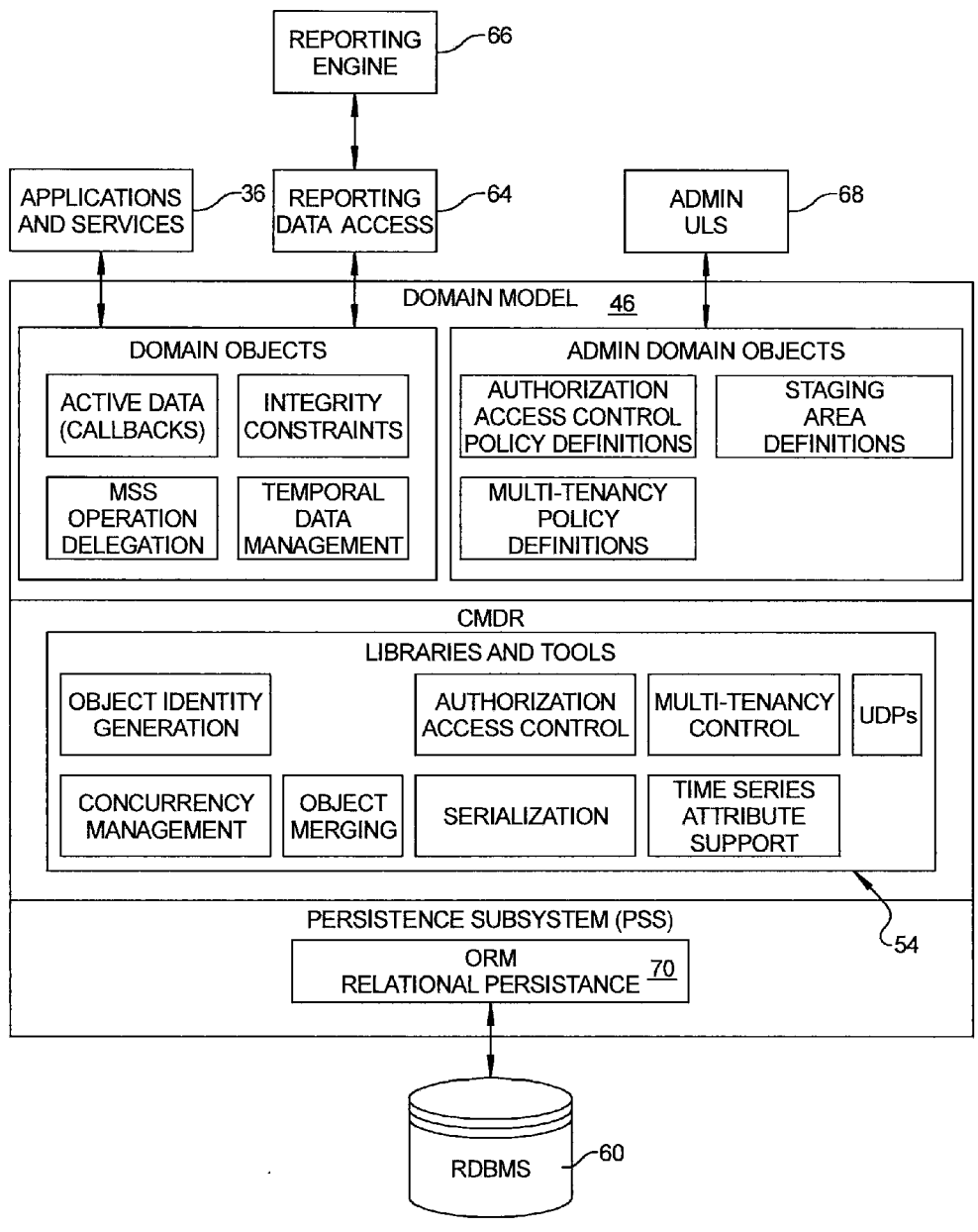
FIG. 7 is a high level block diagram showing the distinction between the domain objects that are used across domain models and DCIM domain objects.

Referring to FIG. 7, the CDMR 54 presents supervision control and data acquisition (SCADA) solution for the entities under management. This interface is tightly coupled to domain objects. The CDMR 54 supports an arbitrary set of domain classes (which constitutes the Domain Model). The CDMR 54 coordinates concurrent object modifications, supports domain object persistence and provides a number of other support services (like object identifier—OID generation conventions/mechanisms). In addition, the CDMR 54 offers a suite of facilities that can be called upon by domain class developers to address cross cutting concerns like authorization resolution/enforcement, multi-tenancy checks, volatile attribute access, etc.

Figure 8:
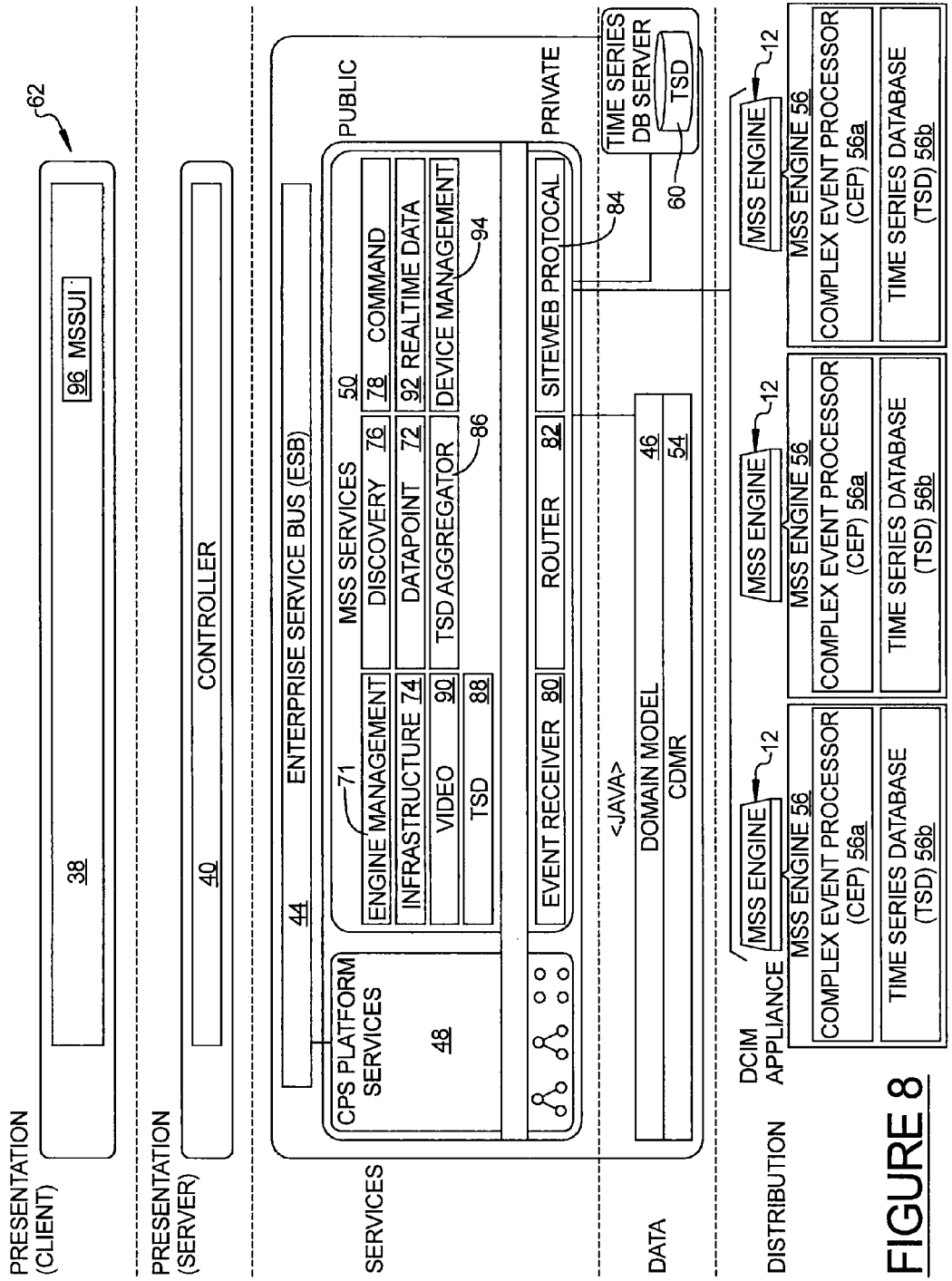
FIG. 8 is a high level block diagram of one example of an architecture showing an interaction of MSS components with the Domain Model and the MSS Engine/DCIM appliance.

For most purposes the DCIM Domain Model 46 hides a Manageability Subsystem (MSS) 62 that is formed by the MSS Services 50 and the MSS engines 56 (to be discussed further in connection with FIG. 8). Command and control operations are initiated through the Domain Model 46 and are delegated to the MSS subsystem 62 as needed.

Under the covers of the DCIM Domain Model 46, the MSS Engines 56 may reuse the CDMR-supported DCIM Domain Model 46. This obviates the need to design a distinct representation of domain model information—and the need to then map that into (and out of) the CDMR 54 supported DCIM Domain Model 46. This also allows the MSS Engines 56 to reuse the CDMR 54 for final (closest to the device and most recent) checking of authorization policies, multi-tenancy policies, integrity constraints and so on. To support multiple network operation centers, each and every CDMR 54 instance may participate in an eager (ASAP) eventual consistency regime.

The above discussion explains a distinction between the domain objects that are used across domain models and DCIM domain objects. Above, the domain objects that apply across domain models are called 'admin domain objects'. Essentially, these are the domain objects that describe some aspect of other domain objects—e.g. authorization policies (about domain objects), multi-tenancy policies (about domain objects), user defined properties (UDPs—associated with domain objects), etc.

In a literal sense, the depicted 'admin domain objects' are the domain model objects contributed by the 'platform' itself. More specifically, the examples shows are contributed by (and potentially required by) the CDMR 54 component of the platform.

The depicted libraries and tools may comprise the CDMR 54. The first of these may be a reusable (JAVA) library for generating global unique identifiers (GUIDS) to serve as object identifiers. Other libraries may help with resolving/enforcing access controls (e.g. authorization), multi-tenancy controls, user defined property management, serialization (e.g. generic, reflection driven, formatting), etc. In this sense, the dividing line between the Domain Model's 46 class implementations, and the CDMR 54, is somewhat blurred. It may be thought of as something of a dashed line. However, all application/service logic should be strongly insulated from whatever happens under the covers of the domain class interfaces. This effectively raises the level of abstraction at which application/service logic is implemented.

Interaction Requirements

The Domain Model 46, and it's supporting CDMR 54, provides storage agnostic data sharing across the DCIM product line. In addition, the Domain-Model/CDMR duo addresses cross cutting concerns related to data access, delegation of appropriate tasks to the Manageability subsystem (MSS) 62, data change triggers/callbacks, etc. Domain Model 46 consumers are application services, common platform services and even the Manageability Subsystem 62. The MSS Services 50 relays discovery information as new instances of Domain Model 46 classes (stored in the CDMR 54). The Domain to Model 46 may represent a single source of truth—and a single source of history.

Applications and Services 36—CRUD Domain Objects as required to support application features.

Reporting Data Access 64—Read only access to the Domain Objects for reporting purposes. This requires a "data provider" for a chosen reporting engine 66.

Admin UIs 68—CRUD Admin Domain Objects defining access policies, multi-tenancy policies, integrity constraint policies and other policies. These policies configure and drive the handling of crosscutting concerns.

Manageability Subsystem 62 delegation—Certain operations (e.g. commands, controls, etc.) associated with domain objects should be delegated to the Manageability Subsystem 62 for ultimate execution. Current, volatile data access (for sensor readings, etc.) should also be delegated to the Manageability Subsystem 62 for real-time fetching (versus latest value/estimate lookup).

ORM/RDBMS 60 access—Domain objects are persisted to the RDBMS 60 via an Object Relational Mapping technology (layer 70). Direct access to the underlying RDBMS is a circumvention of the Domain Model 46 (and supporting CDMR 54) layers. For application/service level logic, direct access to the underlying RDBMS 60 could be a serious architectural violation.

On the other hand, the Domain Model 46 and the CDMR 54 are deliberately extensible, should specific bits of domain class related logic be best implemented via hand-crafted SQL, stored procedures, etc. When faced with some of the relatively rare, but most challenging, implementation needs, it may be necessary to sprinkle the implementation logic at the application level, the domain model level and even the CDMR/ORM/RDBMS levels.

Reuse

The DCIM product line's common data model leverages domain knowledge manifest in the representational models used in Aperture®

Vista, the Avocent® MergePoint™ Infrastructure Explorer (AMIE), the information technology operations management (ITOM) library prototype, DSView, etc. The common data model may also leverage certain aspects of industry standards like the Distributed Management Task Force's (DMTF's) Common Information Model (CIM).

The CDMR 54 may be based on an industry-standard (SQL99) relational database management system (RD-BMS).

Some of the most important domain classes, within the Domain Model 46, delegate manageability operations to the Manageability Subsystem 62. In addition, the Manageability Subsystem 62 feeds discovery/presence information, about domain class instances, into the Domain Model 46. Certain policies, for things like correlated event filtering, are also delegated to the Manageability Subsystem 62 for distributed processing (close to the sources of such events).

Manageability Subsystem

The Manageability Subsystem, represented by reference number 62, is shown in greater detail in FIG. 8. The Manageability Subsystem 62 provides the ability to discover and control Emerson and non-Emerson devices, and collect and analyze real time data from those devices. The Manageability Subsystem 62 may be made up of three major areas:

MSS Services 50—exposes public services on the platform 42 to provide applications and the Domain Model 46 with access to Manageability Subsystem 62 features such as the retrieval of historical data points that have been collected over time and the retrieval of data points on demand directly from the end devices. The Manageability Subsystem 62 provides private services used for communication between the platform 42 and the MSS Engines 56.

TSD 52 (Time Series Database)—stores the historical data points that have been collected over time. Applications and the Domain Model 46 can retrieve these data points through the public interfaces exposed on the platform 42.

Manageability Subsystem 62

MSS Engine 56—may be software that runs in the DCIM appliance 12 providing discovery and control of Emerson® and non-Emerson devices, and collection and analysis of the real time data from those devices. The MSS Engine 56 may contain the knowledge for how to communicate with Emerson® and non-Emerson devices. The MSS Engine 56 communicates with the MSS Services 50 running on the platform 42. Multiple MSS Engines 56 can be deployed in the customer environment to provide scalability as the number of managed devices to be supported grows. Each MSS Engine 56 may use a Complex Event Processor (CEP) 56*a* to ensure real time data aggregation and correlation. A Time Series Database 56*b* may be associated with each MSS Engine 56 for storing collected real time data. The following section briefly describes Manageability Subsystem 62 components with the Domain Model 46 and the MSS Engine 56/DCIM appliance 12.

Engine Management—An Engine Management service 71 provides the ability to manage Domain Model objects that represent the MSS Engines 56 and related objects, such as product knowledge and plug-ins. This service also provides the ability to add, update and manage MSS Engines 56 that are of the DCIM Solution 10.

Datapoint—A Datapoint service 72 provides the ability to access collected metric data and to configure the rules related to data point collection, aggregation, and analysis.

Infrastructure—An Infrastructure service 74 provides the ability to manage the infrastructure (devices, containers, relationships, collection rules, aggregation rules, and analysis rules) of the MSS Engine 56. The to infrastructure service 74 keeps the infrastructure objects synchronized between the Domain Model 46 (and supporting CDMR 54) and the MSS Engines 56. As changes and additions are made to Domain Model objects on the platform 42 the necessary information is synchronized with the MSS Engines 56. The infrastructure service 74 service also handles synchronizing new and updated devices/relationships that are discovered by the MSS Engines 56 with the Domain Model 46 of the platform 42.

Discovery—A Discovery service 76 provides the ability to manage the discovery parameters and also provides means to perform on-demand discovery. The MSS Engines 56 actually perform the on-demand discovery and background discovery activities based on these configured discovery parameters.

Command—A Command service 78 provides the ability to execute commands on devices, such as PowerOff and PowerOn. The MSS Engines 56 actually handle sending the necessary commands to devices or appliances to cause the desired action on a device.

Event Receiver—An Event Receiver 80 service processes unsolicited events received from one or more MSS Engines 56. These events are converted as needed to match the Domain Model 46 definitions of the platform 42 and these events are then forwarded to the Events system of the platform 42.

Router—A Router component 82 handles the routing of requests between the MSS Services 50 and the MSS Engines 56. For requests from the MSS Services 50 this component determines the appropriate MSS Engine 56 to handle the request, such as an on-demand discovery request or a Power Off request. For request from the MSS Engines 56 this component determines the appropriate MSS Service to handle the request.

SiteWeb Protocol—A SiteWeb Protocol component 84 implements proprietary SiteWeb protocol and provides communication between MSS components and MSS Engine 56/DCIM appliance 12.

TSD Aggregator—A TSD Aggregator services 86 communicates with the TSD 60 to perform aggregation of infrastructure container(s) that span devices managed by more than one MSS Engine 56. The aggregation rules define how the data is aggregated and the results are stored in the TSD 60.

Video—A Video service 90 provides the ability to retrieve video content stored or captured in the MSS engines 56. Video data can be streamed from the MSS Engines 56 to consumers.

Realtime Data—A Realtime Data service 92 provides the ability to retrieve metric values in realtime in a streaming/ongoing manner from the MSS Engines 56. The real-time data can be streamed from the MSS Engines 56 to consumers.

TSD—A TSD service 88 provides the ability to manage Domain Model objects that represent the TSD 60 and the ability to configure the TSD 60.

Device Management—A Device Management service 94 provides the ability to perform upgrades, configure and manage devices.

Interaction Requirements

The MSS Services 50 manipulate domain objects via Java interfaces exposed by the Domain Model 46 for data persistence and access. This enables the following:

Provides basic create, update, delete, and querying of domain objects;

Allows for synchronization of new or updated domain objects identified by discovery of the MSS Engine 56;

Allows for synchronization of domain objects between the Platform 42 and the MSS Engines 56; and Allows access to rules to control data aggregation and data analysis.

Delegate methods of the domain objects in the Domain Model 46 may consume public MSS Services 50 using SOAP via the Enterprise Service Bus (ESB) 44. These delegate methods may be used to perform the following activities:

Execution of commands, such as PowerOff;

Retrieve historical metric values;

Retrieve on-demand metric values; and

Perform on-demand discovery operations.

The public and private MSS Services 50 use the Router component 82 to route requests to the appropriate MSS Engine 56.

The MSS Services 50 consume CPS Platform Services of the platform 42 using SOAP via the ESB 44. The CPS Platform Services may be consumed for the following reasons.

Consume Authorization Service to determine that necessary rights for enforcement of functionality provided by the MSS Services 50;

Consume Licensing Services to determine what functionality is available by the MSS Services;

Consuming Eventing Service for the publishing of events; and

Consuming Eventing Services for the registration of notifications based on events.

The MSS Services 50 may use a suitable communications component to communicate with the MSS Engine 56.

The MSS Services 50 interacts with the MSS Engines 56 on the DCIM appliance 12 using a suitable communication component to achieve the following functionality.

Command Execution;

Discovery;

Data Collection;

Firmware Upgrades; and

Configuration.

An MSS UI 96 interacts with the Presentation server 40 (i.e., its controller) over HTTP and the controller interacts with the MSS Services 50 using SOAP or another suitable protocol (e.g., via the ESB 44).

The Application Services 36 (FIG. 5) consume video and real time data streaming via a publication/subscription mechanism from the MSS Services 50. The video and realtime data streaming is retrieved from the MSS Engines 56.

DCIM Appliance

Figure 9:
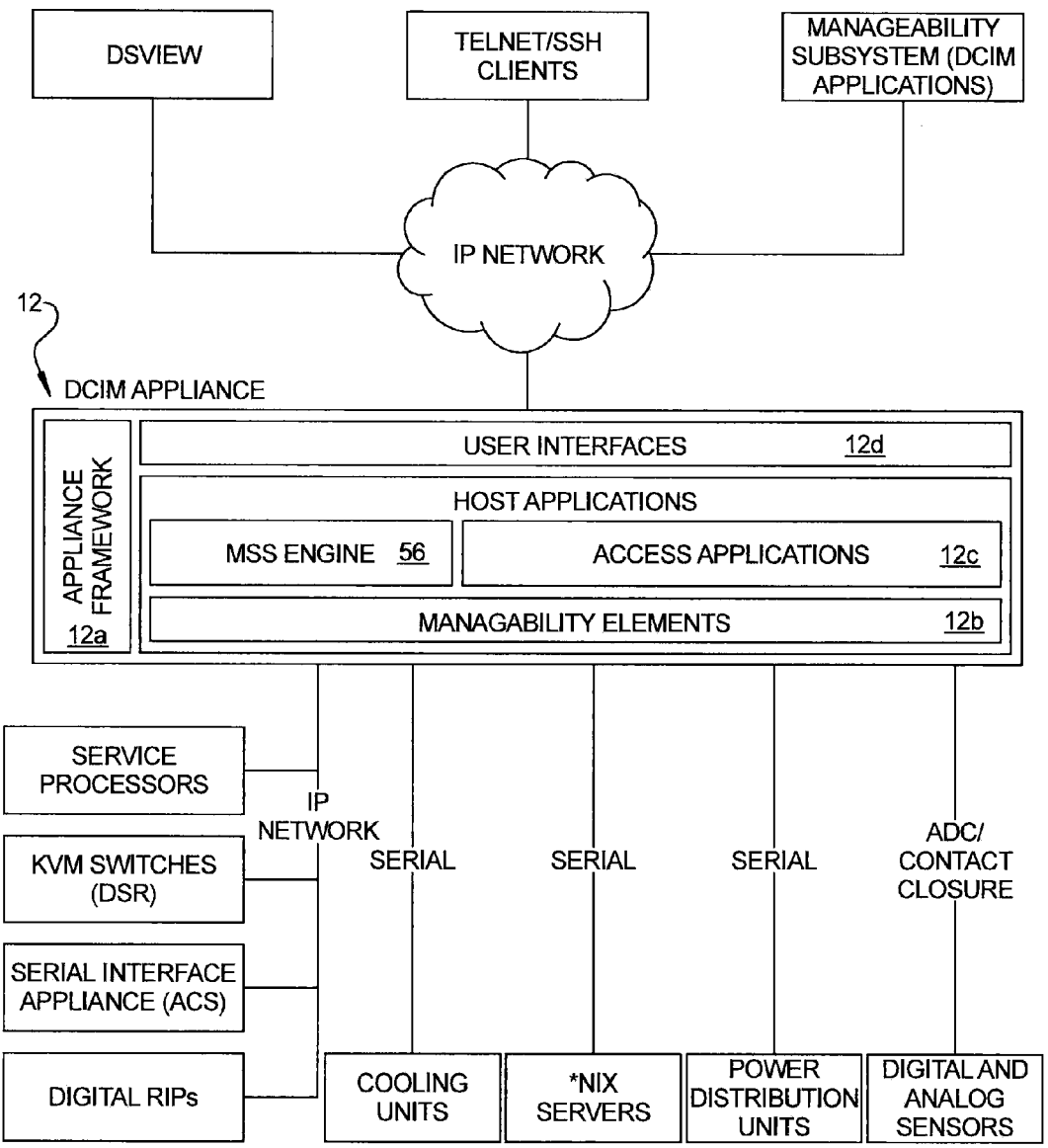
FIG. 9 is a high level diagram of one example of implementing the DCIM solution.
Figure 9A:
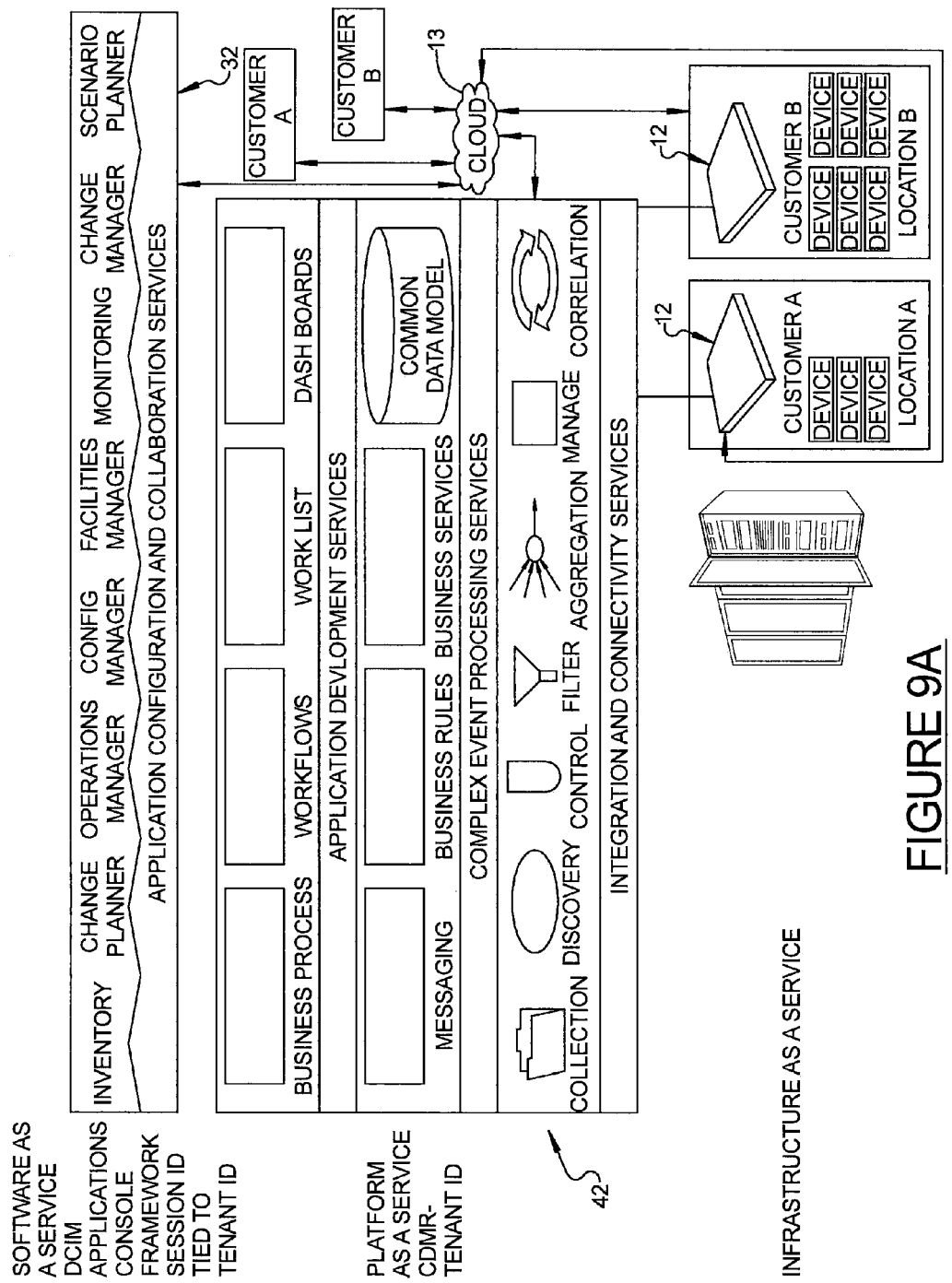

The DCIM appliance 12 is shown in one embodiment in FIG. 9. The DCIM appliance 12 provides the MSS Engine 56 capabilities and therefore provides the gateway between the DCIM Solution 10 application layers and the actual infrastructure devices which are being managed. It also provides a collection of industry standard interfaces such as a WebGUI, an SSH/Telnet based CLI, and SMASH/CLP which allow it to provide device management in a stand-alone environment. The external interfaces are purposely limited to provide a subset of the overall functionality available to the DCIM application suite. There are also Avocent specific protocols that may be used for access purposes which are currently consumed by DSView and may eventually be used for DCIM based access applications.

Architecture of DCIM Appliance

The detailed architecture of the DCIM appliance 12 may be thought of (at a high level) as being a system that is divided into three major areas including 1) Appliance Framework 12a; 2) Manageability Elements 12b/Access Applications 12c, and 3) User Interfaces 12d.

The Appliance Framework 12a provides a set of common services such as database management, authentication, and others which can be used by all of the components in the DCIM Solution 10. Another key part of the framework is a set of standardized communication interfaces that components can use to move data and messages around the DCIM Solution 10.

The "Manageability Elements 12b" can consist of components that know how to speak to the individual managed devices and equipment. Some examples of managed devices and equipment include:

KVM Switches;

Serial Interface appliances;

Power Distribution Units (PDUs);

Digital Rack Interface Pods;

Service Processors;

Cooling units;

Digital and Analog Sensors; and $3^{rd}$ Party devices.

This area also includes the Application components which perform various tasks but do not have any external interfaces. The MSS Engine 56 components such as the CEP 56a and the Time Series Database 56b, as well as some extended features inherited from the access appliance, are all examples of applications.

The User Interface 12d may contain the user interfaces such as the Onboard WebUI, command line interfaces, and importantly a MSS Manageability Protocol for communicating with the MSS engines 56. The communication interfaces provided by the Appliance Framework 12a allow a common method for the UI components to get data and send control messages to the various applications and manageability extensions.

The above described architecture enables the DCIM appliance 12 to be easily deployed in a variety of configurations with support for different numbers and types of managed elements being supported in each configuration. This design based on pluggable components, also allows for easily adding new classes of managed devices as the product line progresses.

Additional CDMR Details

Overview

Figure 10:
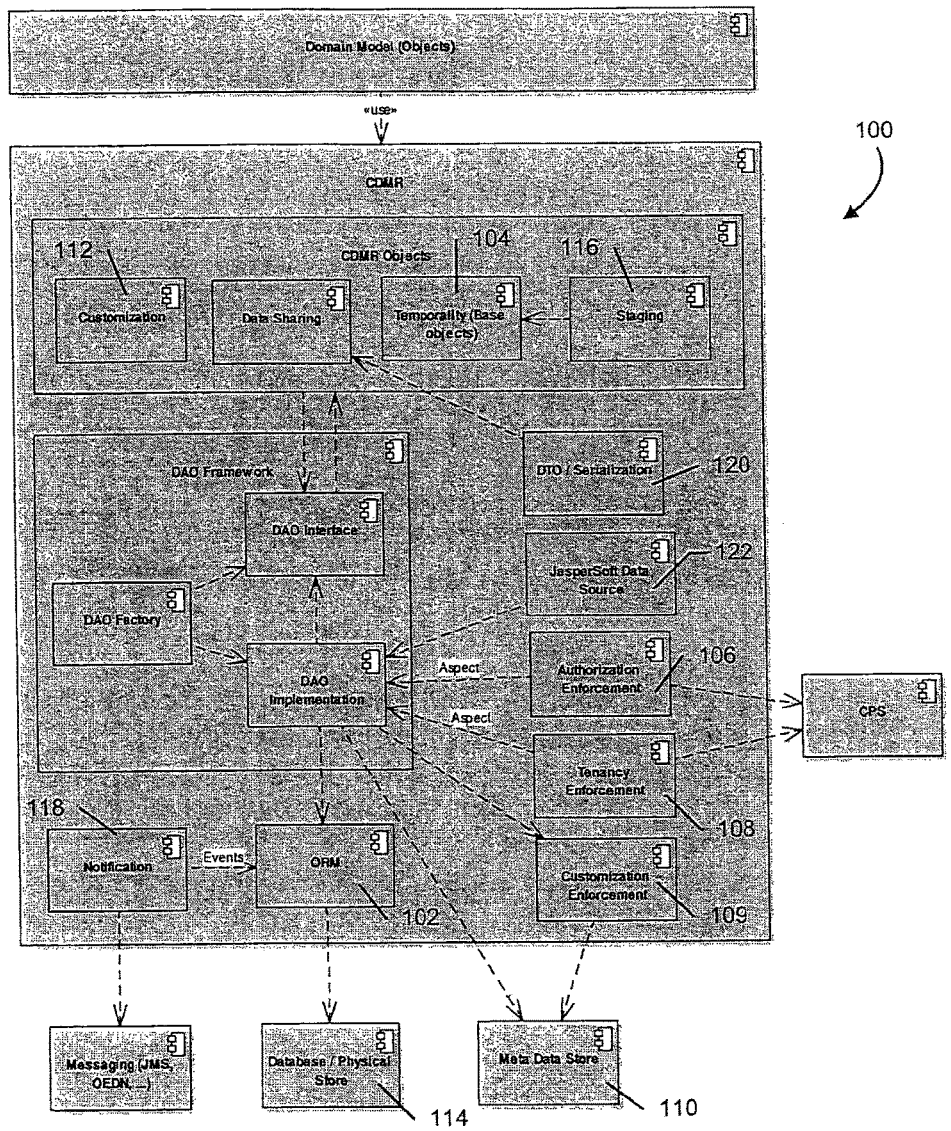
FIG. 10 is a block diagram of one embodiment of the Common Data Model Repository (CDMR)

A more detailed embodiment of the CDMR 54 is shown in FIG. 10 and denoted by reference number 100 (hereinafter the "CDMR 100"). FIG. 11 shows a "Use Case Catalog" for the CDMR 100, and FIGS. 11A-11W show detailed information on each Use Case of FIG. 11, and will be referenced throughout the following discussion.

As noted briefly above, the CDMR 100 provides the storage and access to the data (i.e., facts) that are represented in the Domain Model. The CDMR 100 effectively forms a library that provides support for building the domain objects, extensions of objects, and also provides a persistence layer that persists the object to a database, while essentially "hiding" the persistence layer and the database to the domain layer. The CDMR 100 provides an abstraction of the database by using an ORM layer 102 that maps relational tables to objects. The CDMR 100 also isolates the choice of database from higher layer objects.

The CDMR 100 provides a number of highly useful features. For one, the CDMR 100 is Domain Model "agnostic". This means that the CDMR 100 provides the ability to support an arbitrary set of domain classes (Domain Model) which enables this component to be used by other product lines. The CDMR 100 also provides the foundation for data sharing. This allows multiple consumers to use the same data and provides the ability to extend the data as needed. Still further, the CDMR 100 provides support for a plurality of cross-cutting concerns. One such cross-cutting concern is "temporality". Temporality layer 104 in FIG. 10 provides the ability to maintain the state of an object (past, current, and future) and the ability to retrieve the state of an object as it existed at a particular point in time. The CDMR 100 also provides for authorization enforcement (layer 106 in FIG. 10), tenancy enforcement (layer 108 in FIG. 10) and customization enforcement (layer 109 in FIG. 10). Authorization enforcement is the ability to enforce permissions for viewing and actions related to objects, for different users. Tenancy enforcement is the ability to enforce/restrict the set of objects that are viewable based on the current tenant. It will be appreciated that a current "user" and current "tenant" are different and do not represent the same. A user has the ability to view/manipulate objects in one or more tenants. A user is generally only able to view objects in one tenant at a time, so the tenancy enforcement will restrict the objects presented to the current tenant that the current user is interested in viewing.

Customization enforcement is the ability to enforce user defined constraints for any property of any object, which may include customized objects. The JasperSoft Data Source 122 acts as a data source provider/driver for a reporting engine. This allows the reporting engine to retrieve data from the CDMR 100 for reports and leverages the cross-cutting concerns supported by the CDMR 100.

The CDMR 100 is also "relational database agnostic", meaning it provides the ability to support different relational database types with minimal changes. The CDMR 100 also provides distributed concurrency control, which is the ability to handle multiple consumers accessing and updating the data and preventing these consumers from making changes that will overwrite changes made by other consumers. Still further, the CDMR 100 provides unique identification (ID) generation ("GUIDs"), which is the ability to create unique IDs for objects to prevent the objects from being stored with the same ID. The CDMR 100 also provides notifications via Notification layer 118 in FIG. 10 when objects are modified; in other words the ability for consumers to be informed when changes are made to objects in the Domain Model.

Base Model

A base model feature of the CDMR 100 may provide a set of "base" classes that are used by the Domain Model to define the set of classes for a specific domain. These classes enable the CDMR 100 to be agnostic to the domain model that is supported by the CDMR. These base classes also provide the foundation for the building of a domain model that can be shared by all of the Common Data Model (CDM) consumers (e.g., Applications, CPS, MSS, etc.), allowing information/data to be shared between the different consumers. Two such base classes are 1) "AbstractPersistantObject", from which all classes are derived, and whose instances will be persistent and are not extensions; and 2) "AbstractExtension", from which all extension classes derive. FIG. 10a shows a limited number of examples of some types classes that may be defined using the definition template for the Domain Model (left side of FIG. 10A), as well as examples of multiple instantiation of ones of the various classes (right side of FIG. 10A). The "ComplexObjectType" class 101a is used as a base class to define a type of an object. Each instance of a ComplexObjectType identifies a new type of an object. These types of objects are loaded into the CDMR 100 and can be updated with changes and additional object types over a period of time. One such object might be a server having storage functionality as well as functionality as a firewall. This multi-personality, multi-functionality is handled via an "extension" mechanism. The "ObjectCategory" class 101b allows the designer to identify a category of objects. The types of objects that fall into a specific ObjectCategory are identified by line $101b_1$ between the ObjectCategory 101b and the ComplexObjectType 101a. The set of objects (objects modeling real world objects) that fall into a specific ObjectCategory 101b are identified by the line $101b_2$ between the ObjectCategory 101b and ComplexObject class 101n. Examples could be a class for storage devices, a class for processing devices, or a class for sensing devices. Line $101b_r$ represents Aggregation, indicating that the ObjectCategory 101b class contains (or is composed of) that which is defined in the ComplexObjectType class 101a. The "PhysicalObjectType" class 101c allows a class to be created for physical objects (e.g., servers, PDUs, etc.) having specific physical dimensions (versus non-physical objects such as licenses). The "CapacityValue" class 101d indicates that PhysicalObjectType and PhysicalObject are composed of CapacityValue objects. These are capacities that are associated with a PhysicalObjectType (from class 101c), thus indicating a specific type of capacity and a value. These capacities are also associated with physical objects, as indicated by PhysicalObject class 101p (e.g., all servers having a storage capacity of 500 GB). The "DeviceType" Class 101e allows the designer to define a class for specific devices of a specific manufacturer/model (e.g., a specific model server made by a specific manufacturer). The DeviceType would inherit these characteristics. A Device object 101q that is created from a specific device type would inherit values in the Device inheritance hierarchy (PhysicalObject 101p, ComplexObject 101n) from the DeviceType inheritance hierarchy (PhysicalObjectType 101c, ComplexObjectType 101s). The "PhysicalObjectTypeSide" Class 101f is used to define side types for physical object types. The class 101g, "DwgElementGroup", identifies the drawing elements associated with a side type. Class 101h defines a class, "DeviceTypeOpening", that is composed of elements of both of classes 101f and 101e, and defines the set of device type openings that are associated with a DeviceType. Class 101i is an extension class, "DeviceExtension", that allows a user to further specify some information about a specific one of the objects in class 101e. An example of an extension for a Device is a Rack, where a Rack is a device there is a Device object created and there is a Rack Extension that is created that is associated with the device. The Rack Extension has specific properties/attributes that racks have that are not found on a device. Class 101j, "ConcreteDeviceExtension", inherits from class 101i and represents an actual extension to be defined which is associated with a Device.

As mentioned above, the right side of FIG. 10A provides examples of multiple instantiation of the classes defined on the "Definition Template" side of the Figure. For example, classes 101k, 101m and 101b are classes that are associated with ComplexObject class 101n.

The CDMR 100 provides the set of base classes as Java POJOs (i.e. plain-old-java-objects). These base classes are used (i.e., java inheritance) by the Domain Model to define the domain model classes for a specific domain. FIG. 11A provides additional details for the specific Use Case, "UC-CDMR-DS-0002—Define a domain model class," and FIG. 11B provides the Use Case for "UC-CDMR-DS-0001—Define a data access object." The CDMR 100 also provides base data access classes as Java classes. These base data access classes are used by consumers of the Domain Model (e.g. application services) to perform data access operations, such as FIND, SAVE, UPDATE, and DELETE of Domain Model objects. These base data access classes are also used by the Domain Model to define Domain Model specific data access functionality as well, such as more specialized FIND operations.

The CDMR 100 further provides means for extension classes to be associated with base classes. Detailed information on this feature is presented in FIG. 11C for the Use Case, "UC-CDMR-DS-0003—Define an extension class." An extension class is a Domain Model class that has methods and properties and is associated with another Domain Model class. This capability provides means for the Domain Model to represent a variety of different perspectives (functionality and information) of the same real world object to meet the needs of different Domain Model consumers. An example is an extension that is used to associate Manageability Subsystem (MSS) information with a Domain Model object, such as a specific device (e.g., server). This extension contains additional details that are needed by the MSS and generally not needed by other Common Data Model (CDM) consumers.

From the foregoing, it will be appreciated then that the CDMR 100 provides the capability to map instances of objects to persistent storage, where the objects may include not just data, but connections and control capabilities as well.

Extensibility

An important advantage of the CDMR 100 is its support of "extensibility". It will be appreciated that an application may not be able to meet the needs of all enterprise customers "out of the box". However, this can be accomplished by making changes to the base functionality of the application or by supporting means to extend the application. But changing the base functionality of the application for specific needs of each customer would become costly and difficult to maintain. Providing facilities for extending the base functionality is not nearly as costly and also provides additional flexibility with the application. A key area of importance related to extensibility is the ability to maintain version compatibility of the application when extensions are applied, such that future upgrades have minimal to no impact or cost. Some extensions, such as adding properties/fields to objects or modifications to core code, have a higher risk of not being compatible with future upgrades. As a result, care should be exercised with these types of extensions as described in the sections below. Extensions to the base functionality are categorized into the following 4 groups: "Extension Packs", "Configuration", "Personalization", and "Customization". Each of these will be discussed in greater detail below.

Extension packs are sets of extensions that are created to alter the base functionality to meet particular needs, such as internationalization, compliance, and vertical markets. One or more extension packs can be applied to a base system to meet particular needs and these must maintain compatibility for future upgrades. These extension packs are part of each release and are fully tested and verified for functionality and compatibility. Extension packs may be created by engineering teams that are independent of the team developing the base functionality and can be deployed independently.

The "Configuration" extensions provide the ability for base functionality to be configured by Professional Services to meet particular goals of a customer. Examples of these configurations are: the ability to define constraints on properties/fields for any Domain Model object, the configuration of the processing/flow of a BPEL process, and definitions for additional properties/fields for objects. Configurations leverage well defined control points/hooks that alter how the base functionality operates. These extensions must maintain compatibility for future upgrades. These types of configurations may be maintained in a meta data store (component 110 in FIG. 10) or in configuration files. A more detailed listing of the CDMR 100 configuration features is presented below:

The CDMR 100 provides means for property constraints to be defined for any property of Domain Model classes. These constraints may be used to customize the format, size and valid value set (enumeration, range of values).

The CDMR 100 provides the enforcement of the defined property constraints for Domain Model classes. This allows the constraints of the Domain Model to be altered to meet the needs for a specific vertical without changes being made to the Domain Model.

The CDMR 100 provides means for property constraints to be associated with a specific extension pack. This allows for the definition of property constraints that are grouped together with other extensions for deployment as a pack of extensions during the standard installation or post installation.

The CDMR 100 supports the ability for a deployed system to be upgradable when property constraints have been defined without impacting the defined property constraints. Property constraints that are associated with properties that have been removed will no longer be operational. This allows the system 10 to be upgraded successfully without any additional modifications or alterations to the system.

The CDMR 100 supports the ability to maintain property constraints that are defined by extension packs and by a customer/end user in a manner that they do not cause conflicts.

The CDMR 100 supports the ability for property constraints to be upgraded with newer versions of extension packs that are applied to the system 10.

The CDMR 100 may use the meta data store (component 110 in FIG. 10) to store configuration meta data used by the CDMR, which includes property constraints definitions.

The feature of "Personalization" provides the ability for the Customer/End User to alter the base functionality for a single user or a set of users to meet their needs. Examples of these personalizations are: settings that change the appearance of the presentation/application, sets of values shown in menus, and definitions for additional properties/fields for objects. Extensions must maintain compatibility for future upgrades. Some Customer/End User involvement may be necessary if properties/fields defined for objects have been removed in a new version. More detailed features of the Personalization features provided by the CDMR 100 are presented below:

The CDMR 100 provides support for user defined properties (UDPs) to be added to any Domain Model class. The data types that are to be supported for these UDPs are integer, string, date, and timestamp. These UDPs provide means to define additional data (properties) to be associated with a Domain Model object that is unique for a customer/deployment or which does not yet exist in the provided Domain Model. An example is adding a UDP for emergency contact information. The CDMR 100 provides means for UDPs to be associated with a specific extension pack.

The CDMR 100 supports the ability for a deployed system to be upgradable when UDPs have been defined without impacting the UDPs. UDPs that are associated with Domain Model classes that have been removed will no longer be operational. This allows the system 10 to be upgraded successfully without any additional modifications or alterations to the system 10.

The CDMR 100 supports the ability to maintain UDPs that are defined by extension packs and by a customer/end user in a manner so that they do not cause conflicts.

The CDMR 100 supports the ability for UDPs to be upgraded with newer versions of extension packs that are applied to the system 10.

The CDMR 100 provides an interface that can be leveraged by a plug-in for the Management Console to configure personalization information, which includes property constraints definitions and user defined property definitions. This allows the customer/end user the ability to configure these personalization extensions for their system to meet their particular Domain Model needs.

The CDMR 100 may use the meta data store (component 110 in FIG. 10) to store personalization meta data used by the CDMR, which includes user defined property definitions.

The "customization" extensions are represented by box 112 in FIG. 10 and are modifications made by Professional Services or Partners that are certified to properly alter the base functionality to meet the needs of a customer. Examples of these customizations are user defined classes and modifications to the base code. These customizations may be significant enough that upgrades to the system will require additional customizations/alterations, increasing the costs for upgrades. All customizations need to be carefully evaluated to determine if additional requirements should be incorporated into the base functionality to enable these customizations to be achieved via configuration or personalization. Specific customization features that the CDMR 100 provides are:

The CDMR 100 provides support for user defined classes (UDCs). These UDCs are classes that represent real world objects just like any other object that is defined in the Domain Model, except that they are defined by Professional Services or a Certified Partner after an installation. These UDCs provide means to define additional classes to represent objects that are not modeled in the provided Domain Model. An example is adding a UDC that represents an application.

The CDMR 100 provides support for associating/relating UDCs with other Domain Model classes. These associations/relations between UDCs and other Domain Model classes allow the system administrator/professional services to model real world relationships to help them better manage and represent their environment. An example is associating a UDC that represents an application with the server that is hosting the application.

The CDMR 100 supports the ability for a deployed system to be upgradable when UDCs have been defined without impacting the UDCs. This allows the system 10 to be upgraded successfully without any additional modifications or alterations to the system.

The CDMR 100 provides an interface that can be leveraged by a plug-in for the Management Console to configure customization information, which includes UDC definitions. This allows the system 10 to be customized by Professional Services or a Certified Partner to meet the Domain Model needs for a customer.

The CDMR 100 uses the meta data store 110 to store customization meta data used by the CDMR, which includes user defined classes.

Figure 13:
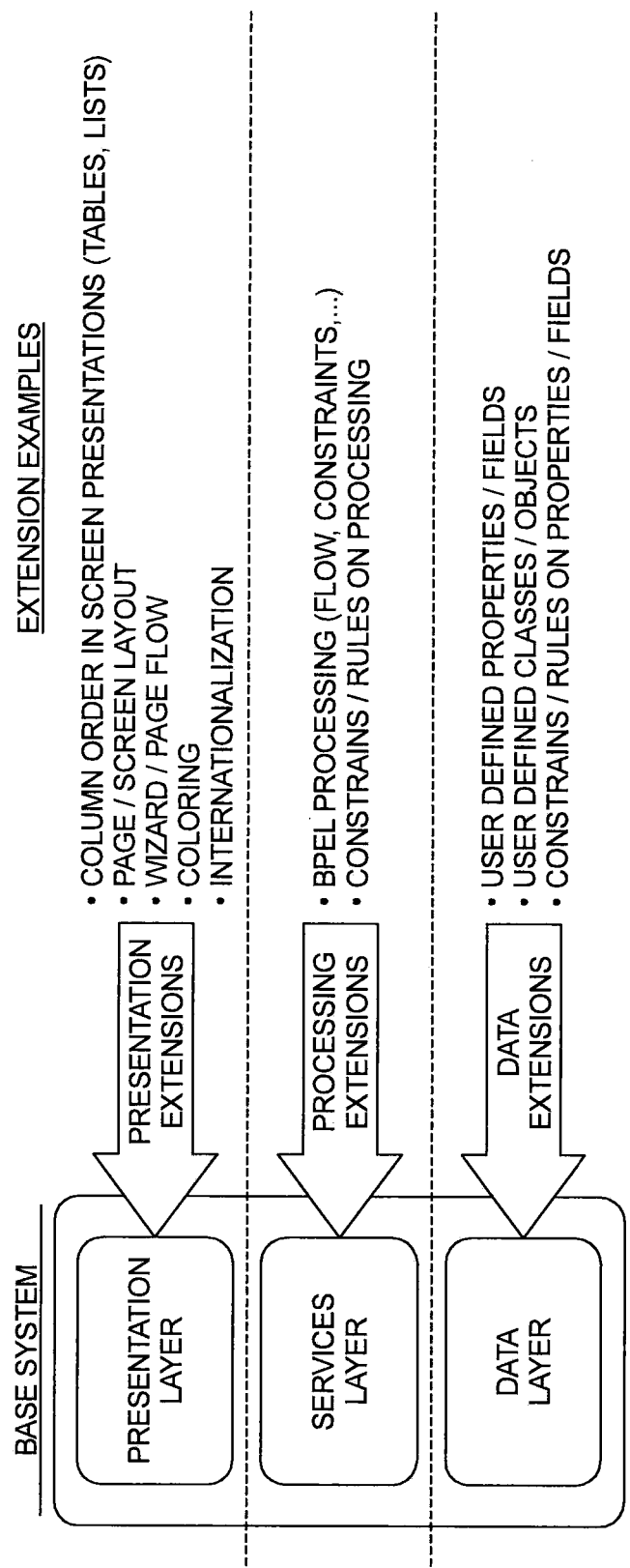
FIG. 13 is a diagram of the layers of the system that can be extended to alter the deployed solution, along with examples of extensions for each layer.

A tool (impact analysis tool) may also be constructed to evaluate the extensions that have been applied to a deployed system 10 to identify any areas that will not upgrade automatically when an upgrade is applied to the system. This will enable Professional Services, Certified Partners, and customers to be aware of any additional work or costs that will be required to allow the system 10 to be upgraded successfully. The diagram of FIG. 12 provides an overview of how the different layers of extensions relate to one another and how they can be used together to alter the base functionality. Extensibility of an application may span three areas, which are presentation, processing, and data. Presentation represents the view to the consumer, such as a graphical user interface (GUI) or an application programmatic interface (API). Processing represents the behaviors and operation of the system, such as services and business logic. Data represents the information/facts that are managed or used to make decisions by the application and consumers. FIG. 13 provides an overview of the layers of the system 10 that can be extended to alter the deployed solution. This diagram also provides examples of extensions for each layer. In FIG. 13 it will be understood that the term "user" may mean not just individuals, but any form of consumer such as, but not limited to, applications making use of the CDMR 100.

Internationalization

The CDMR 100 provides support for processing and storing of data values in a standard format (UTF-8) to enable support of internationalized content.

Persistence Ignorance

The CDMR 100 also incorporates a persistence ignorance feature. The persistence ignorance feature enable the CDMR 100 to be ignorant of the specific type/vendor of the database (component 114 in FIG. 10) that is being used to persist data. All of the database specific information may be maintained in a set of files, generally mapping files, that are switched out based on the specific database that is being used for the deployed solution. This allows the CDMR to 100 support the required set of databases with the same basic code, expect for the different mapping files, and possibly some specific stored procedures, and also enables the CDMR to leverage other databases in the future if necessary. Additional detailed information on this feature is provided in FIG. 11F for the Use Case, "UC-CDMR-DB-0001—Data Base Choice At Install."

Object Manipulation

The object manipulation feature of the CDMR 100 enables the "merging" and promotion of Domain Model objects. Merging is the process of taking two instances of Domain Model classes and merging these into a single instance. The instances that are being merged represent the same real world object, which can happen since there may not be sufficient information that defines the instance to determine that they represent the same instance and prohibit the duplicates from being added. This can occur when different users add instances, or when instances are added dynamically via Manageability Sub-System discovery, data imports, or in other ways. Promotion is the process of promoting an instance of a Domain Model class to a more specialized instance, such as a physical object being promoted to a device. This situation can occur when an instance of a real world object is initially created as a less specialized object, since a user, or Manageability Sub-System discovery, data import which is adding the object is not aware that the object is really more specialized, then later it is determined that the object is really more specialized, so it needs to be promoted. The CDMR 100 also provides support for the elaboration or promotion of instances of a Domain Model class into instances of a more specialized Domain Model class. This elaboration/promotion capability provides means for instances of the Domain Model that are created by one consumer to be elaborated/promoted to a more specialized Domain Model object by the same or another consumer that is able to determine that the existing instance is really represented by a different Domain Model object or an has an additional extension. The CDMR 100 also may provide support for the merging of domain class instances to a single domain class instance. This merging capability provides means for resolving situations where there are multiple domain class instances that represent the same real world object. Additional details of this feature are presented in the Use Case of FIG. 11G, "GUC-CDMR-OM-0001—Object Promotion", and in the Use Case of FIG. 11H, "UC-CDMR-OM-0002—Object Merging."

Data Integrity

The integrity of the data that is persisted by the CDMR 100 is highly important for the integrity of the application and services that are presenting, processing and using this data. The CDMR 100 maintains the referential integrity of the data that is persisted and provides support for cascading deletes. By "maintains the referential integrity of the data" it is meant that the CDMR 100 maintains valid relationships (foreign keys) between tables in the database (component 114 in FIG. 10). The cascading delete support handles the deleting of the necessary objects/information that is related to an object that is being deleted by a consumer of the Domain Model, which will eliminate situations of unreferenced/unused objects being left in the database and also eliminate situations of objects having references to objects that no longer exist. All other data integrity concerns may be handled by the Domain Model. Additional information concerning the cascading delete support feature is presented in the Use Case of FIG. 11I, "UC-CDMR-DI-0001—Cascading Delete."

Concurrency Controls

In a large system multiple users or subsystems may attempt to update the objects in the database. Because these interactions can be done on multiple threads of execution, it presents a potential problem of resource contention and locking. To avoid the problems associated with this contention, such as reading data that is old or data that was uncommitted, etc., a concurrency scheme is put into place. The concurrency scheme of "Optimistic Locking" is the concurrency scheme that is preferably used by the CDMR 100. This scheme allows multiple users to have read access to the data and when a user attempts to make a change, a check is made on a version field (also known as a "write-lock" field) to ensure that the data has not changed since the user read the data. If the version field has changed, then the change is not allowed and the user is informed that a change has been made by another client. Additional information concerning this feature is presented in the Use Case of FIG. 11J, "UC-CDMR-CC-0001—Multiple Updates."

Object Identity

Each Domain Model object has a unique identity which allows the object to be referenced/identified with this object identity. It is important that the system 10 does not use or assign the same identity to multiple objects, which can lead to the wrong object being manipulated or operated on. The CDMR 100 provides support to generate unique identifiers for every domain object that is added. These generated unique identifiers need to be globally unique so that the same identification is never generated twice. The CDMR 100 supports the use of the same unique identifier to represent domain objects in the CDMR 100 and the MSS TSD (Time Series Database). This allows consumers of the CDMR 100 and the MSS TSD to be able to retrieve information related to an object using the same unique identifier. Additional details of this feature are provided in the Use Case of FIG. 11K, "UC-CDMR-OI-0001—Adding Object with Unique Id."

Authorization Enforcement

Authorization is a function of specifying the access rights to resources, which defines who is authorized to do what on which resources. The Common Platform Services (CPS) provides the management of Authorization and the CDMR 100 provides the authorization enforcement of data that is requested via the Domain Model. The CDMR 100 leverages the CPS authorization service(s) to gather information that can be used to determine which resources are available for a particular user. The CDMR 100 provides authorization enforcement on the "CREATE", "READ", "UPDATE" and "DELETE" of domain model data. This restricts the set of data and operations that are provided to the domain model consumer based on the rights of a particular consumer/user. The CDMR 100 leverages the Common Platform Services (CPS) authorization service(s) to retrieve the necessary authorization enforcement information for authorization enforcement. Additional information concerning this feature is available in the Use Case shown in FIG. 11L, "UC-CDMR-AE-0001—Change Objects with Authorization Enforcement" and in the Use Case of FIG. 11M, "UC-CDMR-AE-0002—Retrieving Objects with Authorization Enforcement."

Multi-Tenancy

Multi-tenancy is a capability of a single instance of running software that is serving multiple client organizations (tenants). Multi-tenancy is contrasted with a multi-instance where separate software instances (or hardware systems) are set up for different client organizations. With multi-tenancy, a software instance is designed to virtually partition its data and configuration so that each client organization works with a customized virtual software instance. The Common Platform Services (CPS) provides the management of Tenancy and the CDMR 100 provides the tenancy enforcement (via layer 108 in FIG. 10) of data that is requested via the Domain Model. The CDMR 100 leverages the CPS tenancy service(s) to gather information that can be used to determine which resources are available for a particular user. The CDMR 100 provides tenancy enforcement on "CREATE", "READ", "UPDATE" and "DELETE" of Domain Model data. This restricts the set of data and operations that are provided to the Domain Model consumer based on the tenant membership/view of a particular consumer/user. The CDMR 100 leverages the Common Platform Services (CPS) tenant service(s) to retrieve the necessary tenant enforcement information for tenant enforcement. Additional information on this feature is available in the Use Case shown in FIG. 11N, "UC-CDMR-TE-0001—Change Objects with Tenancy Enforcement", and in the Use Case of FIG. 11O, "UC-CDMR-TE-0002—Retrieving Objects with Tenancy Enforcement."

Temporality

Temporality is the capability to record the state of a Domain Model object and/or its properties over time (past, current, and future). This capability enables applications to plan future changes to the Domain Model; provides the ability to review past changes; and provides the ability to view the current state of the Domain Model. Future changes do not automatically become current/active once the actual time reaches the time of a planned change. All future changes are maintained as future changes until they are explicitly committed to the current time. So the timeline for temporality is not a simple straight time line, but rather it is actually a Z-timeline as shown in FIG. 14. This allows some future/planned changes to actually have a time in the past or in the future. The temporality features for the CDMR 100 may be further summarized as follows:

- The CDMR 100 provides support for the ability to persist and maintain Domain Model objects and Domain Model object properties state for desired times (past time, future time, and current time). This capability provides means for domain model consumers to view the state of a domain model object or its properties at any time (past, current, or future) and the ability to plan for future changes.
- The CDMR 100 provides access to temporal data in a manner that is similar and as simple as the method for accessing non-temporal data. The basic expectation is that the means for accessing temporal data should leverage some additional context information that provides details on the time of the temporal data to be accessed or manipulated.
- The CDMR 100 supports the ability to access temporal data with a consistent performance/response-time that is independent of the amount of temporal data that is maintained (number of states/timestamps) for the data that is being accessed. Domain Model consumers are able to rely on a consistent response time for accessing temporal Domain Model objects and domain model object properties as the temporal data related to the Domain Model object grows.
- The CDMR 100 provides the ability to delete future data changes (i.e. planned data changes). This capability allows Domain Model consumers to cleanup/remove planned future changes to the Domain Model that are no longer required or desired.
- The CDMR 100 provides the ability to commit future data changes (i.e. planned data changes) to the current time. This capability allows Domain Model consumers to indicate that future data changes have now been realized and are part of the current/active domain model.
- The CDMR 100 does not allow changes to be made to persisted Domain Model objects and/or Domain Model object properties in the past. This prevents the changing of history and maintains the integrity of the historic timeline.
- The CDMR 100 provides means to track planned/future changes even when the current time passes the planned/future time of a change. Future changes are not automatically converted to being current/active when the planned/future time associated with a change is reached. This capability allows the Domain Model consumer to control when future/planned changes are committed to the current time, since some planned changes in the real world do not always get completed when expected or planned.
- The CDMR 100 provides means for Domain Model objects and/or Domain Model object properties to be "temporal", "historic" or "eternal". A "temporal" object/property indicates that the state of the object/property is fully tracked over time (past/history, current, and future). An "historic" object/property indicates that the current and historic states of an object/property are tracked. An "eternal" object/property indicates that no history or no future tracking is provided, only the current state is maintained. This provides the flexibility for the domain model designer to determine how the state of objects/properties are maintained.

Additional information on this feature is available in the Use Case shown in FIG. 11P, "UC-CDMR-TM-0001—Change Temporal Objects", and the Use Case in FIG. 11Q, "UC-CDMR-TM-0002—Retrieving Temporal Objects."

Staging Area

The CDMR 100 further may include a staging area, as shown by box 116 in FIG. 10. The staging area provides a type of "sandbox" facility allowing CDM consumers to examine and manipulate the Domain Model in a way that the changes do not affect the actual domain model objects. Once the Domain Model objects in the staging area are determined to be accurate or of value to be incorporated into the actual Domain Model objects, then they are committed or they can be deleted if no longer needed. The CDMR 100 provides the ability to support an arbitrary number of staging areas. This provides flexibility for staging areas for different purposes to be used simultaneously.

The CDMR 100 provide the ability for adding new Domain Model objects to the staging area 116 or existing Domain Model objects. This provides the flexibility for the Domain Model consumer to manipulate existing Domain Model objects and/or new Domain Model objects, without causing any impact to the current Domain Model objects. The CDMR 100 also provides the ability to commit changes made to Domain Model objects in the staging area to the current time. This capability allows for Domain Model objects to be manipulated in the staging area to a point where they reach a level of quality, and then they can be committed to the current timeline.

The CDMR 100 provides the ability for the staging area to be deleted. All of the changes made to Domain Model objects in the deleted staging area may be deleted as well. This capability allows for staging areas to be deleted if it is determined that the contents of the staging area are no longer needed and not planned to be committed to the current timeline. The CDMR 100 provides the ability to delete data changes in the staging area. This capability allows Domain Model consumers to cleanup/remove staged changes to the Domain Model that are no longer required or desired. Additional details on this feature may be found in the Use Case shown in FIG. 11R, "UC-CDMR-SA-0001—Changing Objects within a Staging Area," and in the Use Case shown in FIG. 11S, "UC-CDMR-SA-0002—Committing Objects in Staging Area."

Notifications

Notifications provide means for CDM consumers that have registered for notifications to be notified when changes (additions, updates, deletes) are made to Domain Model objects. This allows the CDM consumers to perform any desired activities after being informed of the changes, such as refreshing the data presented to an end user. The CDMR 100 provides the ability for CDM consumers to register/unregister for notifications via the notification system 118 shown in FIG. 10. Additional details of this feature are presented in the Use Case of FIG. 11T, "UC-CDMR-NO-0001—Notification Registration," and in the Use Case shown in FIG. 11U, "UC-CDMR-NO-0002—Distribute Notifications."

Serialization

The CDMR 100 also provides means for the serialization of Domain Model objects to and from XML, as indicated by box 120 in FIG. 10. CDM consumers may use this functionality for an XML representation of the objects that are exposed on the Service Bus and the Mediator shown in FIG. 5, that are used for data import/export, and for data transfer objects. These XML representations can also be used as the format for the data that is exposed by services of the DCIM solution when exposed via Web Services. Additional details of this feature are available in the Use Case shown in FIG. 11V, "UC-CDMR-SE-0001—Serialize Object."

Reporting

Reporting provides the ability to edit/design, view/distribute generated reports, and generate/execute reports. The CDMR 100 contributes to the editing/designing and the generation/execution areas of reporting. The CDMR 100 provides information on the data that is used by the report designer and also provides the actual data that is used by the report engine when executing reports. The CDMR 100 provides means, such as a driver/data source (e.g., the JasperSoft Data Source 122), for the CPS report engine to access to retrieve data from the CDMR 100 that is required for reports. This provides the ability for data used in reports to leverage authorization and multi-tenancy enforcement checks provided by the CDMR 100. The CDMR 100 also provides means to retrieve information on the Domain Model that can be used by the report designer of CPS. This Domain Model information may be used by the report designer to identity the objects and properties that are needed for the report. Additional details of this feature may be found in the Use Case of FIG. 11W, "UC-CDMR-RP-0001—Execute Report."

Database Management

Database management is the process and use of facilities to manage and maintain the integrity of data and the operation of the database. This functionality spans database backups and restores to supporting distributed environments with database replication. The CDMR 100 leverages the database management capabilities provided by the Common Platform Services (CPS). These capabilities include database backup, restore, recover, compaction, clustering, lock management, log maintenance, repair/verify integrity and replication.

Data Encryption

Data encryption provides means for data to be transformed (encrypted) into a format that is unreadable except for those that have then necessary information to decrypt the data. The CDMR 100 provides means for the Domain Model to indicate fields that need to be encrypted when they are stored in the database so that private information, such as passwords, are not stored in the clear. The CDMR 100 provides the ability for properties of Domain Model objects to be encrypted prior to storing in the database and decrypted prior to being returned from the database. This capability allows specific properties of the Domain Model to be unreadable when stored in the database.

Scalability

Scalability is the ability of a system to continue handling increasing workload with minimal or no performance degradation and without major restructuring. The CDMR 100 is able to be scaled to support at least four predetermined configurations: "small", "medium", "large" and "enterprise" (small=5 updaters and 20 viewers; medium=10 updaters and 50 viewers; large=10 updaters and 100 viewers; and enterprise=50 updaters and 200 viewers), and to meet all other non-functional requirements. The CDMR 100 leverages the database clustering capability provided by the database management features of the Common Platform Services (CPS). This capability allows the database to scale to support increased workloads. The CDMR 100 is designed to support the addition of caching products such as Oracle "Coherence" or "TopLink Grid" that can be added at a later time to address performance and scalability in large environments. The CDMR 100 is able to scale to support enterprise environments with up to 125,000 managed elements (racks, devices, and virtual servers), or potentially an even greater number of managed elements.

Interoperability

The CDMR 100 is interoperable with a Domain Model to provide CDMR functionality for the objects manipulated via the Domain Model classes. The CDMR 100 may interoperate with CPS Authorization Service for authorization information needed for authorization enforcement. The CDMR 100 may interoperate with the CPS Multi-Tenancy Service for tenancy information needed for tenancy enforcement. The CDMR 100 may interoperate with the CPS Report Engine to provide the data necessary for report execution. The CDMR 100 may interoperate with the CPS Report Designer to provide information on the Domain Model for the creation of reports.

High Availability

The CDMR 100 may support the ability to be deployed on multiple servers that are centrally and remotely located and provides a single unified view of data. The CDMR 100 may support the ability to continue operating even when one or more of the CDMRs deployed on a different server is/are not operational. This capability allows the CDMR 100 to be highly available. The CDMR 100 may leverage the database replication capability provided by the database management features of the Common Platform Services (CPS). This capability allows the multiple database instances to be deployed at different locations. The CDMR 100 may leverage the database clustering capability provided by the database management features of the Common Platform Services (CPS). This capability allows the database to support high availability.

Reuse

The DCIM product line's common data model leverages domain knowledge manifest in the representational models used in Aperture®Vista, the Avocent® MergePoint™ Infrastructure Explorer (AMIE), the information technology operations management (ITOM) library prototype, DSView, etc. The common data model may also leverage certain aspects of industry standards like the Distributed Management Task Force's (DMTF's) Common Information Model (CIM).

The CDMR 100 may be based on an industry-standard (SQL99) relational database management system (RDBMS).

Some of the most important domain classes, within the domain model, delegate manageability operations to the manageability subsystem (MSS). In addition, the manageability subsystem feeds discovery/presence information, about domain class instances, into the domain model. Certain policies, for things like correlated event filtering, are also delegated to the MSS for distributed processing (close to the sources of such events).

CONCLUSION

The DCIM Solution 10 can thus be seen to form a comprehensive family of hardware and software products that provides highly effective and efficient management of data center infrastructure. The DCIM Software Suite shown in FIG. 4 allows the datacenter manager to completely control and manage every aspect of his/her enterprise, whether locally or remotely, from a graphically rich, web-based user interface (UI). The DCIM appliance 12 helps to accomplish this through the use of a single piece of hardware (either per rack, per zone or per data center), where in the past multiple hardware devices/units have been required. Together, the DCIM appliance 12 and the DCIM Software Suite allow the datacenter manager not only to manage his/her current configuration, but to project and plan ahead for future needs, and when those needs become reality, to implement/accommodate them quickly, seamlessly and cost-effectively.

The overall DCIM Solution 10 also enables significant scalability. For one, the DCIM Solution 10 enables an option to connect to a separate database server of a DB server farm; and/or the ability to conform to load balancing systems for web access to a larger user community; and the ability to conform to reporting servers to serve a larger number of report requests. The DCIM Solution 10 also enables the ability to conform to security and access system requirements, and the ability to conform to directory services systems for authentication and authorization and role information for users.

From the foregoing discussion of the CDMR 100, it will be appreciated that the CDMR 100 thus may be configured to manage or provide any of: data that identifies or describes the object; data that provides status, state and capabilities of the object; data that provides performance and operational aspects of the object; data that provides the settings, configurations and properties of the object; data that controls a behavior of the object; data that changes a behavior of the object; data that provides operational aspects of the object; and data that provides relationships and associations of the object with other objects. From the foregoing discussion it will also be apparent that the CDMR 100 may also perform any of the foregoing operations on the data: retrieving the data; updating the data; creating the data; deleting the data; analyzing the data; transforming the data; validating the data; authorization of the data including enforcement; tenancy on the data including enforcement; temporality of the data; storing of the data; backing up of the data; and restoring of the data.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A processor-based system that forms a base platform that enables a non-transitory medium, housed by the system, to be used to store a plurality of objects to be used in forming a plurality of different domain models, the system including:

a database forming a common data model repository having an object relational mapping layer for mapping instances of the objects to persistent storage;

wherein the instances of objects represent information that that fails within base classes, and wherein the base classes include specific base classes for helping to define connection capabilities by which each one of said instances of objects is able to connect with one or more other objects, and one or more other control capabilities for at least certain ones of the instances of objects which enable said certain ones of the instances of objects to implement a specific control feature, so that different managed elements represented by instances of Objects are modeled with base classes in accordance with a common connection capability and a common control capability; and where wherein the common data model repository implements the connection capabilities and control capabilities in relation to managed elements.

2. The system of claim 1, wherein the common data model repository further operates to persist the instances of the objects to a database independently of action models.

3. The system of claim 1, wherein the common data repository is configured to manage data that describes, or is maintained by, an object that is managed by the system.

4. The system of claim 3, wherein the common data repository is configured to manage or provide data relating to at least one of:

data that identifies or describes the object;
data that provides status, state and capabilities of the object;
data that provides performance and operational aspects of the object;
data that provides the settings, configurations and properties of the object;
data that controls a behavior of the object;
data that changes a behavior of the object;
data that provides operational aspects of the object; and
data that provides relationships and associations of the object with other objects.

5. The system of claim 1, wherein the common data model repository manages data relating to the object by performing a plurality of the following operations:

retrieving the data updating the data; creating the data; deleting the data; analyzing the data; transforming the data; validating the data;
authorization of the data including enforcement:
tenancy on the data including enforcement;
temporality of the data;
storing of the data;
backing up of the data; and
restoring of the data.

6. The system of claim 1, wherein the common data model repository supports extending objects by adding different attributes to the objects to form extended objects.

7. The system of claim 1, wherein the common data model repository supports new objects types that were not provided for initially in the domain model.

8. The system of claim 1, wherein the common data model repository it functionality for providing customization enforcement for enforcing user defined constraints for any property of any of said objects.

9. The system of claim 1, wherein the common data model repository includes a concurrency functionality that allows multiple users to have access to a given piece of data, and which causes a check to be made on a version field of the given piece of data to ensure that the given piece of data has not changed since the user first read the given piece of data.

10. The, system of claim 1, wherein the common data model repository includes a functionality for implementing a staging area where a user may examine and manipulate domain model objects of a given domain model, without effecting changes to actual domain model objects that are present in the given domain model.

11. The system of claim 1, wherein the common data model repository further includes functionality for enabling a user to register for notifications to be generated for the user whenever additions, modifications or deletions are made to any instance of an object of one the domain models.

12. The system of claim 1, wherein the common data model repository further provides functionality for enabling a cascading delete feature, where the cascading delete feature enables deleting of information related to a specific object that is being deleted by a user of the domain model.

13. The system of claim 1, wherein the common data model repository makes use of a plurality of bases classes including:
a "AbstractPersistentObject" class from which all other classes used to define ones of said objects derive, and whose instances are persistent, and which is not an extension of any other class; and an "AbstractExtension" class from which all ones of said classes that are used as extensions of other ones of said classes derive.

14. A processor-based system that forms a base platform that enables a non-transitory medium, housed by the system, used to store a plurality of objects to be used in forming a plurality of different domain models, the system including:
a database for helping to form a common data model repository having an object relational mapping layer for mapping instances of the objects to persistent storage, the instances of objects including information which defines base classes with which the instances of objects are associated with, and wherein the base classes help to define connection capabilities by which a given one of said instances of an object may be connected with other ones of said instances of objects, and control capabilities for enabling said instances of objects to implement a specific control feature, so that different managed elements, represented by corresponding instances of objects, are modeled with base classes in accordance with a common connection capability and common control capability;
the common data model repository further providing a unified approach to applying a plurality of cross cutting concerns to the instances of objects as the instances of objects are used by different applications associated with different domain models, and wherein the common data model repository implements the plurality of cross cutting concerns in relation to at least one of the instances of objects and managed elements; and
the plurality of cross cutting concerns including at least one of:
authentication;
authorization resolution and enforcement;
temporality;
multi-tenancy checks; and
customization enforcement for enforcing user defined constraints for any property of any of said objects.

15. The system of claim 13, wherein the instances of objects is useable by a given one of the domain models to enable the instances of objects to be extended to form new instances of objects that can be added to the given one of the domain models, to extend the functionality of the given one of the domain models.

16. The system of claim 13, wherein the instances of objects are extended by forming extension packs, wherein the extension packs provide a set of extensions to at least one object that alters a base functionality of the object.

17. The system of claim 13, wherein the common data model repository is configured to manage or provide data relating to at least one of;
data that identifies or describes the objects;
data that provides status. state and capabilities of the objects;
data that provides performance and operational aspects of the objects;
data that provides the settings, configurations and properties of the objects;
data that controls As a behavior of the objects;
data that changes a behavior of the objects;
data that provides operational aspects of the objects; and
data that provides relationships and associations of the object with other objects.

18. The system of claim 13, wherein the common data model repository manages data relating to the objects by performing a plurality of the following operations:
retrieving the data; updating the data; creating the data: deleting the data; analyzing the data; transforming the data; validating the data;
authorization of the data including enforcement;
tenancy on the data including enforcement;
temporality of the data;
storing of the data:
backing up of the data; and
restoring of the data.

19. A processor-based system that forms a base platform, and which has a non-transitory medium, housed by the system, used to store a plurality of objects to be used in Forming a domain model, the system including:
a database helping to form a common data model repository (CDMR) having an object relational mapping layer for mapping instances of the objects to a persistent storage device, and wherein the instances of objects include base classes, and wherein the base classes help to define connection capabilities for connecting with other objects, and control capabilities associated with a control feature, so that different managed elements represented by instances of objects are modeled with base classes in accordance with a common connection capability and a common control capability;
the common data model supporting at least one of:
extending at least one of the objects by adding at least one attribute to the at least one of the objects to form a new extended object; and
a new object type that was not initially provided for in the domain model.

20. The system of claim 16, wherein the common data model repository is configured to provide a unified approach to applying a plurality of cross cutting concerns to the instances of objects as the instances of objects are used by different applications associated with different domain models, and wherein the common data model repository implements the plurality of cross cutting concerns in relation to at least one of the instances of objects and managed elements; and
the plurality of cross cutting concerns including at least one of: authentication;
authorization resolution and enforcement; temporality;

multi-tenancy checks; and customization enforcement for enforcing user defined constraints for any property of any of said objects.

21. The system of claim 19, wherein the common data model repository is configured to manage or provide data relating to at least one of:

data that identifies or describes the object;

data that provides status, state and capabilities of the object;

data that provides performance and operational aspects of the object;

data that provides the settings, configurations and properties of the object;

data that controls a behavior of the object;

data that changes a behavior of the object;

data that provides operational aspects of the object; and data that provides relationships and associations of the object with other objects.

22. The system of claim 19, wherein the common data model repository manages data relating to the object by performing a plurality of the following operations:

retrieving the data; updating the data; creating the data; deleting the data; analyzing the data; transforming the data; validating the data; authorization of the data including enforcement; tenancy on the on the data including enforcement; temporality of the data; storing of the data; backing up of the data; and restoring of the data.

23. A method that makes use of a non transitory medium, housed by system, which is used to store a plurality of objects to he used in forming a plurality of different domain models, the method including:

using a database to help form a common data model repository having an object relational mapping layer for mapping instances of the objects to persistent storage;

wherein the instances of objects represent information that includes base classes, and wherein the base classes help to define connection capabilities possessed by ones of the plurality of instances of objects to connect with other ones of the objects, and control capabilities for at least certain ones of the instances of objects that represent control features possessed to enable a specific control functionality; and wherein the common data model repository implements the connections and control capabilities in relation to managed elements, so that different managed elements represented by specific instances of objects are modeled with base classes in accordance with a common connection capability and a common control capability.

* * * * *